(12) United States Patent
Wuchse et al.

(10) Patent No.: US 7,551,454 B2
(45) Date of Patent: Jun. 23, 2009

(54) THIN-FILM ASSEMBLY AND METHOD FOR PRODUCING SAID ASSEMBLY

(75) Inventors: Markus Wuchse, Hausmannstaetten (AT); Nikolai Haslebner, Zeltweg (AT); Ronald Frosch, Graz (AT); Manfred Riedler, Kumberg (AT); Günther Leising, Graz (AT)

(73) Assignee: AT & S Austria Technologie & Systemtechnik Aktiengesellschaft (AT)

( * ) Notice: Subject to any disclaimer, the term of this patent is extended or adjusted under 35 U.S.C. 154(b) by 496 days.

(21) Appl. No.: 10/568,563

(22) PCT Filed: Sep. 9, 2004

(86) PCT No.: PCT/AT2004/000308

§ 371 (c)(1),
(2), (4) Date: Feb. 17, 2006

(87) PCT Pub. No.: WO2005/025282

PCT Pub. Date: Mar. 17, 2005

(65) Prior Publication Data

US 2006/0231837 A1    Oct. 19, 2006

(30) Foreign Application Priority Data

Sep. 9, 2003   (AT) ............................. A 1415/2003
May 24, 2004   (AT) ............................. A 894/2004

(51) Int. Cl.
*H05K 1/18* (2006.01)
(52) U.S. Cl. ................... 361/761; 361/751; 361/793
(58) Field of Classification Search ............. 361/761, 361/749, 751, 792, 793
See application file for complete search history.

(56) References Cited

U.S. PATENT DOCUMENTS

| 4,594,282 | A |   | 6/1986  | Kawaguchi et al. |
| 4,827,328 | A |   | 5/1989  | Ozawa et al. |
| 4,839,558 | A |   | 6/1989  | Mierzwinski |
| 5,463,229 | A | * | 10/1995 | Takase et al. ............. 257/59 |
| 5,830,529 | A | * | 11/1998 | Ross ......................... 427/152 |

(Continued)

FOREIGN PATENT DOCUMENTS

DE          197 15 658        10/1998

(Continued)

*Primary Examiner*—Dean A. Reichard
*Assistant Examiner*—Xiaoliang Chen
(74) *Attorney, Agent, or Firm*—Ladas & Parry

(57) ABSTRACT

A thin-film assembly (1) including a substrate (2) and at least one electronic thin-film component (8) applied on the substrate by thin-film technology, wherein a base electrode (4) is provided on the substrate, on which base electrode thin-film layers (21) forming part of the thin-film component are arranged together with an upper top electrode (9); the substrate (2) is comprised of a printed circuit board (2) known per se and including an insulation-material base body (3) and a metal coating as the conductor layer (5), wherein the conductor layer (5) forms the base electrode (4) and, to this end, is smoothed at least on the location of the thin-film component (8), and wherein a contact layer (18) is applied by thin-film technology between the smoothed, optionally reinforced, conductor layer (5) and the superimposed thin-film layers (21) of the thin-film component (8), which contact layer is physically or chemically adsorbed on the surface of the base electrode (4).

37 Claims, 16 Drawing Sheets

U.S. PATENT DOCUMENTS

Figure 1A:
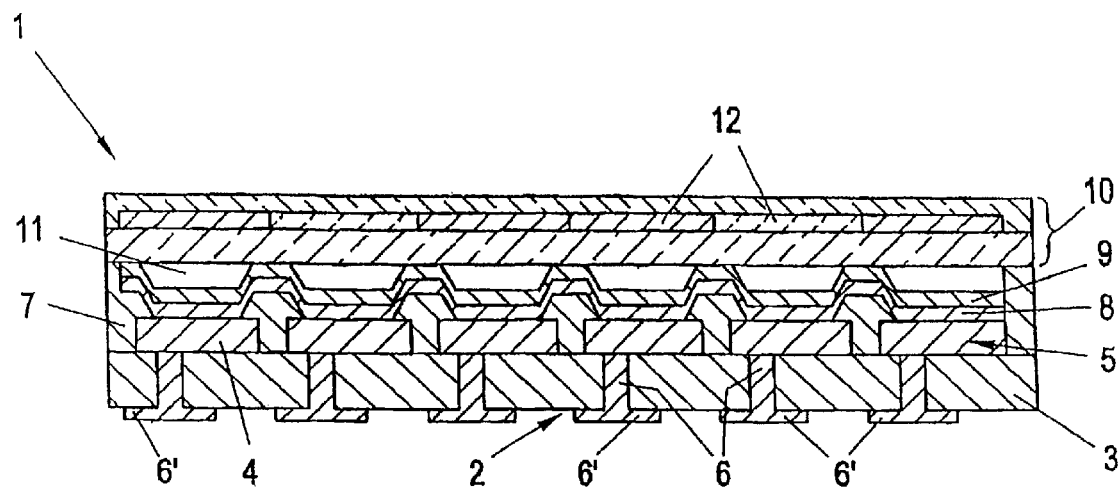

| | | | |
|---|---|---|---|
| 6,404,473 B1 * | 6/2002 | Kaneko et al. | 349/139 |
| 6,544,674 B2 * | 4/2003 | Tuller et al. | 428/698 |
| 6,638,378 B2 * | 10/2003 | O'Bryan et al. | 148/527 |
| 6,673,716 B1 * | 1/2004 | D'Couto et al. | 438/656 |
| 6,674,097 B2 * | 1/2004 | Komoto et al. | 257/98 |
| 6,845,184 B1 * | 1/2005 | Yoshimura et al. | 385/14 |
| 6,891,194 B2 * | 5/2005 | Izumi | 257/59 |
| 6,910,812 B2 * | 6/2005 | Pommer et al. | 385/92 |
| 7,268,486 B2 * | 9/2007 | Ottermann et al. | 313/504 |
| 7,278,326 B2 * | 10/2007 | Kobayashi et al. | 73/862.041 |
| 2002/0039000 A1 | 4/2002 | Shirakawa et al. | |
| 2002/0109796 A1 * | 8/2002 | Lin et al. | 349/43 |
| 2002/0123176 A1 * | 9/2002 | Izumi et al. | 438/149 |
| 2003/0076649 A1 * | 4/2003 | Speakman | 361/524 |
| 2003/0218153 A1 * | 11/2003 | Abe | 252/500 |
| 2004/0118600 A1 * | 6/2004 | Lee et al. | 174/260 |

FOREIGN PATENT DOCUMENTS

| | | |
|---|---|---|
| EP | 0 854 662 | 7/1998 |
| EP | 1 087 649 | 3/2001 |
| WO | 97/03460 | 1/1997 |

* cited by examiner

THIN-FILM ASSEMBLY AND METHOD FOR PRODUCING SAID ASSEMBLY

The invention relates to a thin-film assembly including a substrate and at least one electronic thin-film component applied on the substrate by thin-film technology, wherein a base electrode is provided on the substrate, on which base electrode thin-film layers forming part of the thin-film component are arranged together with an upper top electrode.

Correspondingly, the invention also relates to a method for producing a thin-film assembly including at least one electronic thin-film component which is applied to a substrate by thin-film technology.

From U.S. Pat. No. 4,839,558 A, an assembly including electroluminescent elements provided on a substrate is known, which may serve as a printed circuit board and carry other electronic components. The known electroluminescent assembly is applied on the substrate as a thick-film structure, with the electroluminescent layer being printed on copper-clad base electrodes being left after etching. A transparent glass cover with an internal tin-oxide layer forming the electrode is attached thereabove by the aid of an adhesive. Such a structure involves the drawbacks of not only having comparatively large dimensions, particularly in the thickness direction, but also being complex to produce.

On the other hand, it is known from EP 1 087 649 A to apply an electroluminescent assembly to a substrate and within an encapsulation by thin-film technology, with, in particular, an organic (but also inorganic) light-emitting layer being provided as the active electroluminescent layer. Below the same, a base electrode is applied on the substrate, for instance, by deposition from the vapor phase, and above the light-emitting layer a conductive material is similarly deposited from the vapor phase to form the top electrode. With a view to providing a matrix-like assembly of electroluminescent elements for a display, the top electrodes are arranged in line form and the base electrodes in column form, whereas the active electroluminescent elements are disposed "pointwisely". In view of the thin-film technology applied in that case to realize the electroluminescent assembly, a glass substrate is employed, which can be provided with a sufficiently smooth surface in order to enable the individual thin-film layers to be readily attached, while additionally safe-guarding the required inert property, i.e., that no substances will diffuse out of the glass material into the respective thin-film structure. Such a glass substrate, however, involves the disadvantage of being comparatively complex and expensive to produce and less suitable for the mounting of further electronic components, particularly in the course of a miniaturized circuit assembly.

Yet, a classic printed circuit board including a metallic coating, in particular a copper coating, on an insulating or dielectric base body is not compatible with thin-film technologies.

It is the object of the invention to overcome those drawbacks by providing a technique that renders feasible the production of thin-film assemblies in a simple and cost-effective manner without requiring complex glass substrates for the same. The invention, in particular, aims to enable the use of conventional printed circuit boards and the integration of desired electronic thin-film components like, in particular, electroluminescent assemblies, but also other electronic components, directly in the same while, of course, additionally allowing the mounting of electric components in a conventional manner.

In accordance with the invention, the thin-film assembly of the initially defined kind is characterized in that the substrate is comprised of a printed circuit board known per se and including an insulation-material base body and a metal coating as the conductor layer, that the conductor layer forms the base electrode and, to this end, is smoothed at least on the location of the thin-film component, and that a contact layer is provided by thin-film technology between the smoothed, optionally reinforced conductor layer and the superimposed thin-film layers of the thin-film component, which contact layer is physically or chemically adsorbed on the surface of the base electrode.

In accordance with the invention, a conventional printed circuit board is thus "conditioned" in order to render it compatible with thin-film systems. In doing so, the conductor layer, i.e., the metal facing of the printed circuit board is smoothed and/or polished to form the base electrode in order to thereby provide a base for a thin-film assembly. If required, the thus obtained base electrode may still be chemically or electrochemically reinforced, the mentioned smoothing of the surface of the base electrode in that case being effected upon attachment of such reinforcement. The smoothing, in particular, results in a maximum mean surface roughness of 10 nm and, preferably, 3 nm, the respective roughness assessment being limited to technologically relevant surfaces having dimensions of 20×20 $\mu m^2$ (micro-roughness). Unevennesses of larger lateral extents (macro-roughness) are irrelevant in terms of thin-film technology. On the thus obtained microscopically smooth surface of the base electrode, a contact layer will then be present, which is preferably metallic, yet may also be any other inorganic or organic chemical layer or even semiconductor layer, and which is, in particular, able to fulfil several functions: On the one hand, this contact layer serves to passivate the metal coating (base electrode) such that no substances will diffuse from the metal coating into the superimposed thin-film assembly including, e.g., organic electroluminescent layers. On the other hand, the contact layer constitutes, in particular, a contact-"promoting" layer to enhance and stabilize the electric contact between the active or passive thin-film layers of the thin-film component and the base electrode. Furthermore, this contact layer also constitutes an adhesion-improving layer to stabilize the adherence of the thin-film structure on the base electrode, thus ensuring long-term adherence. The respective contact layer naturally is to be selected depending on the respective thin-film component to be integrated, and it is generally patterned by way of photolitography and by means of common thin-film technologies, i.e., by thermal evaporation, cold cathode deposition, spin coating etc. The contact layer is, for instance, comprised of a metal such as, in particular, aluminum, gold, palladium or platinum etc., yet also conductive suspensions or solutions, e.g., polyaniline, polyethylene dioxithiophene/polystyrenesulfonic acid etc. may be used to make the contact layer. By smoothing the conductor layer forming the base electrode, and applying the contact layer, a good adhesion of the respective thin-film structure as well as an adequate electric contact will be ensured, thus enabling the integration of thin-film structures in conventional printed circuit boards having dielectric base bodies and metal coatings. The printed circuit boards may, as mostly employed today, in this case be comprised of an epoxy-resin base body provided with a double-sided copper coating. The copper coating or, generally, metal coating as such is comparatively thick and, in an advantageous manner, may also serve as a cooling element for the respective thin-film structure; for this cooling function, the copper coating may be chosen accordingly thick (or reinforced). Yet, it is, of course, also possible to use flexible printed circuit boards, which are also called "conductor track foils" and comprise, for instance, an insulating-material base body of polyimide, polyethylenenaphthalate or polyester, wherein a metal coating, e.g. of copper, may again be provided as conductor layer.

It should be noted that the previously mentioned term "electronic" is to be understood in a broad sense, encompassing, in particular, electro-optical systems or layers such as, in particular electroluminescent assemblies as are known per se, cf. EP 0 854 662 A in addition to the documents U.S. Pat. No. 4,839,558 A and EP 1 087 649 A mentioned in the beginning. In a similar manner, however, solar cells, sensors and, in particular, optical sensors, yet also temperature sensors and the like and, furthermore, such electronic components as diodes, transistors, field-effect transistors, light-emitting diodes, resistors, capacitors and protective elements (e.g., snubbers) are, for instance, also conceivable as "electronic" thin-film components comprising the technology according to the invention. As is known per se, these thin-film components may each be protected by an encapsulation against ambient influence, wherein it is, in particular, further feasible to incorporate getter materials within the encapsulation, which encloses a free, gas-filled volume, said getter materials absorbing oxygen and/or water contained in the gas volume and, hence, protect the thin-film component against undesired chemical processes. In the event of an electroluminescent or photovoltaic assembly or an optical sensor as a thin-film component, the encapsulation is made to be translucent or transparent, as is the top electrode and a separate contact layer optionally disposed below the same, which may again be—additionally—provided for contact-enhancement, stabilization and passivation.

In the event of an electroluminescent assembly, the encapsulation in a manner known per se may be equipped with color converting and/or index matching layers oriented to the local base electrodes or local thin-film components, respectively.

In view of the use of a conventional printed circuit board as a substrate, which has been rendered feasible by the invention in an advantageous manner, and the resulting options for providing the most diverse patterns of local base electrodes, it will be of particular advantage with an electroluminescent device constituting a thin-film component system, if local base electrodes having individual feedthroughs are provided on the printed circuit board within an insulating grid structure, with a planar electroluminescent thin-film system as well as a planar, or strip-wisely or symbol-wisely patterned, top electrode being arranged thereabove. With such a configuration, the respective thin-film structure plus top electrode can be integrated in a particularly simple manner without loosing any of the control options for the individual electroluminescent elements.

Another advantage of the use of a conventional printed circuit board consists in that so-called via connections, which are known per se, may be provided for the contacting of the electrodes through the base body of the printed circuit board. Such feedthroughs and, in particular, laser-drilled feedthroughs, due to their narrow, miniaturized attachment, offer the possibility to integrate components and, in particular, optoelectronic components having particularly high densities so as to enable the obtainment of, for instance, display systems including a plurality of small, closely adjacent pixels, i.e. high-resolution display systems. Feedthroughs based on mechanical bores or plasma-etched connections are, however, also conceivable. In an advantageous manner, the feedthroughs for the connection of the base electrodes are provided directly below these base electrodes; this is referred to as a via-in-electrode (VIE) structure. It is, however, also feasible, and common in respect to the contacting of top electrodes, to position feedthroughs in an offset manner relative to the associated electrodes, which will require the establishment of a horizontal electric connection from a via pad on the upper side of the printed circuit board to the component. Such a structure is called via-off-electrode (VOE) structure.

When applying several thin-film components on a printed circuit board, what will usually happen, it will be required to eliminate the zones on the metal coating of the printed circuit board between the thin-film components, whereby also an additional insulation comprising, for instance a photoresist, is provided and attached in a laterally patterned manner by a photolithographic process. Such insulations enclose the individual thin-film components inclusive of their base electrodes, thus insulating the same relative to one another. In this case, it is also suitable, prior to the attachment of the insulations, to "close", by a passivation layer applied by conventional thin-film technology, the printed circuit board zones uncovered from the metal coating or conductor layer, to thereby prevent any contamination of the respective thin-film component by substances emerging from the base body of the printed circuit board. Said passivation layer may, for instance, be comprised of silicon oxide, a sol-gel system or an epoxy compound. Here too, the respective passivation layer is, of course, to be again selected depending on the nature of the remaining materials and, in particular, the material of the base body of the printed circuit board, the passivation, as a rule, being photolithographically patterned and applied by common thin-film processes such as, for instance, thermal evaporation, spin coating, ink printing processes or cold cathode coating etc. Instead of such a patterned, local application, the initially full-surface, uniform application of a passivation layer, for instance as a laminate, is, however, also feasible, with patterning being subsequently realized by the aid of photolithographic etching techniques.

As already mentioned above, an essential characteristic feature for the applicability of conventional printed circuit boards in the present thin-film assemblies is to be seen in that the conductor layer, and local base electrodes obtained from this conductor layer by patterning, are smoothed so as to obtain a low surface roughness. Said smoothing may be realized in various manners known per se, with mechanical, yet also electrochemical, chemical and chemicomechanical smoothing procedures and/or polishing by ion etching as well as combinations of these methods being conceivable. In this respect it is, in particular, feasible to smooth the conductor layer by chemical etching using, for instance, sulfuric acid, nitric acid or chromosulfuric acid. On the other hand, it will also be of advantage if the conductor layer is smoothed by bombardment with particles of individual or several atoms or molecules, such as, e.g., argon or argon clusters.

If reinforcements of the local base electrodes are provided, it is, furthermore, suitable to previously passivate the printed circuit board temporarily in the remaining zones by photolitographic procedures. The passivation layer applied to this end is subsequently removed again only before the application of the respective thin-film components and, in particular, the contact layers.

If the conductor layer is patterned to form local base electrodes, it is, moreover, feasible to carry out the smoothing of the conductor layer only before such (particularly photolitographic) patterning of the conductor layer.

As already mentioned above, not only rigid printed circuit boards, but also flexible printed circuit boards can be employed in the context of the technique according to the invention. Presently, such flexible printed circuit boards are, for instance, used as mechanically robust and space-saving connection means in multi-faceted forms, for instance as "flat ribbon cable substitute", which not only enable the establishment of movable connections between individual electric components of an appliance, but also permit the optimum arrangement of a printed circuit board within the available interior of a housing by bending, folding and twisting. The integration of thin-film components in such flexible printed circuit boards according to the technique described herein now offers the option to utilize the flexible zone by integrating passive or active thin-film components without this resulting in a stiffening of the printed circuit board—as, for instance, in the case of conventional rigid, thick components. Thus, movable, flexible and mechanically robust components will be obtained, and the printed circuit board like the thin-film component itself will, hence, be stressed under mechanical load to a substantially lesser degree on account of the low volume and low mass of the thin-film components. The use of flexible printed circuit boards and, consequently, flexible thin-film assemblies is conceivable for many applications such as with mechanically highly stressable elastic electronic components that are exposed to vibrations, accelerations etc., with components whose flexibility is part of their functionality such as in the event of keyboards or sensors, with "mountable" folding circuit boards to bendable or even roll-up screens.

With such flexible printed circuit boards, the conductor layer is again "conditioned" as pointed out above, so as to render it compatible with the respective thin-film system. The conductor layer forming the base electrode of the thin-film component is, thus, smoothed or polished and optionally reinforced; moreover, the base electrode is provided with a component-adequate contact layer, which may be applied by a common thin-film process, i.e. by thermal evaporation, cold cathode coating, spin coating etc. Basically, all thin-film processes are, by the way, excellently suitable for the coating of flexible substrates to thereby form flexible structures, wherein adaptations are to be optionally provided during the process, above all, for the transport of the substrates between the individual process stations. Hence, no modification of the structure of the respective thin-film component will be required, if a rigid printed circuit board is replaced with a flexible printed circuit board, and it is exactly thin-film technologies which, due to the use of flexible printed circuit boards, allow for an expansion of the application spectrum to active flexible sheet materials, thus enabling the production of altogether flexible and ultralight thin-film assemblies having the smallest component dimensions and which are able to cope with strong mechanical stresses such as vibrations and high accelerations or decelerations to a largely greater extent than comparatively clearly thicker and heavier, conventional components. It is even possible to obtain mounted folding or roll-up circuit boards, i.e., thin-film assemblies that allow for the optimum spatial adaptation of the electronic components to the respective appliance or housing. Flexible passivation or flexible encapsulation will not constitute any problems to them, either. Instead of gluing with rigid glasses, it is, for instance, feasible to use thin glass laminates or polymer-oxide composite layer systems which offer sufficient protection against the penetration of gases or moisture despite their small thickness and, hence, will effectively prevent any contamination of the respective thin-film components. The suitable choice and design of the encapsulation material in respect to the flexible printed circuit board substrate also allows for the arrangement of the integrated thin-film component exactly in the neutral plane of the whole assembly such that only low tensile and pressure forces, if any, will occur in the event of a deflection of the overall system in the thin-film component itself, i.e. in the region of the boundary layer: printed circuit board/encapsulation.

The flexible encapsulation layer may optionally be prefabricated and attached to the printed circuit board, wherein, for instance, an adhesion layer as an adhesion-promoting intermediate layer as well as a passivation layer as a barrier layer against moisture and air may then be provided. Yet, the encapsulation layer may optionally also be directly built up as a composite system above the thin-film component.

In the event of optoelectronically active thin-film components or displays, the (flexible) encapsulation suitably is again designed to be transparent or translucent, yet it is also feasible to make the flexible printed circuit board to be transparent or translucent, for instance, by using polyethylene terephthalate, polyacryl or polyether etherketone, these base materials being provided with transparent or semi-transparent metal films, metal alloys, conductive metal oxides (e.g., aluminum-doped zinc oxide, zinc-doped indium oxide, etc.) and/or conductive suspensions or solutions (based on polyaniline or polyethylene dioxithiophene/polystyrenesulfonic acid).

The option to fold or roll flexible printed circuit boards comprising optoelectronically active thin-film components is of particular importance especially to display systems: In this respect, elastic, mechanically robust and roll-up or folding screens as well as roll-up or folding photovoltaic cells may be envisaged. Besides, roll-up or folding keyboards as well as other operating controls in which thin-film assemblies comprising flexible printed circuit boards are used are extremely advantageous, above all, in the field of portable electronic appliances, so-called hand-helds.

As regards the production of thin-film components comprising flexible printed circuit boards as substrates, the so-called roll-to-roll process is applicable in a particularly advantageous manner. This process uses a flexible printed circuit board sheeting that is unwound from a reel, with a prefabricated flexible encapsulation sheeting being supplied and applied above the thin-film component, said encapsulation sheeting being likewise unwoundable from a reel. In this context, it is, of course, also feasible to provide as reel material either only the flexible printed circuit board or only the flexible encapsulation.

During smoothing and/or polishing, a temporary reinforcement of the flexible printed circuit board may also be provided, such as, for instance, by guiding the flexible printed circuit board sheeting over a table, or by temporarily arranging a carrier film on the back of the flexible printed circuit board to be smoothed, in order to ensure the stiffening of the substrate during the smoothing and/or polishing procedures. This temporary reinforcement or stiffening means can be removed again during the further manufacturing process at any desired, suitable stage.

Figure 1B:
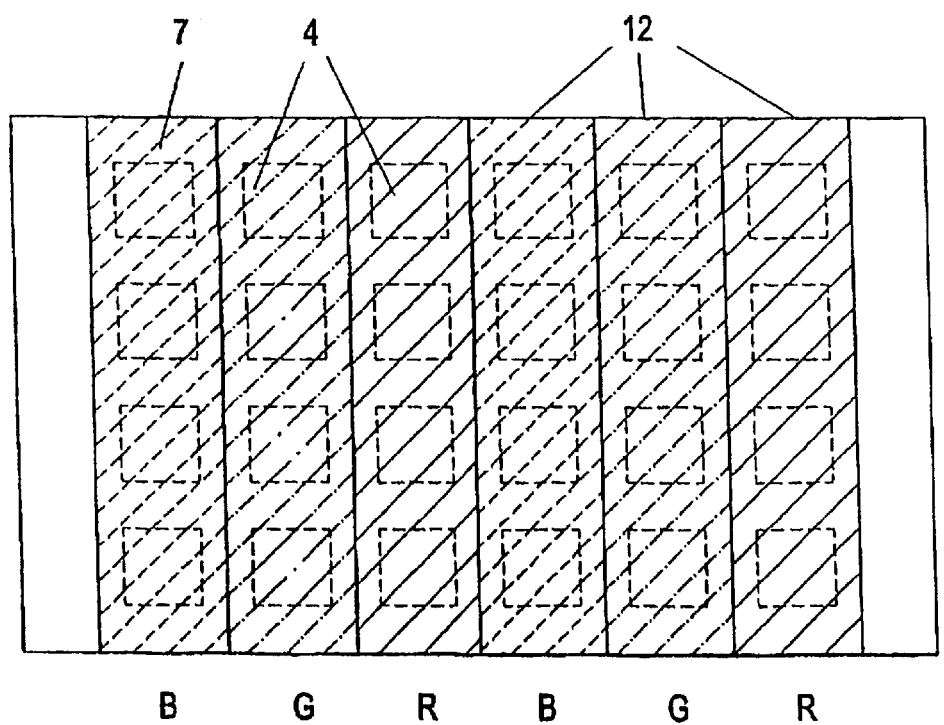
Figures 2A, 2B, 2C:
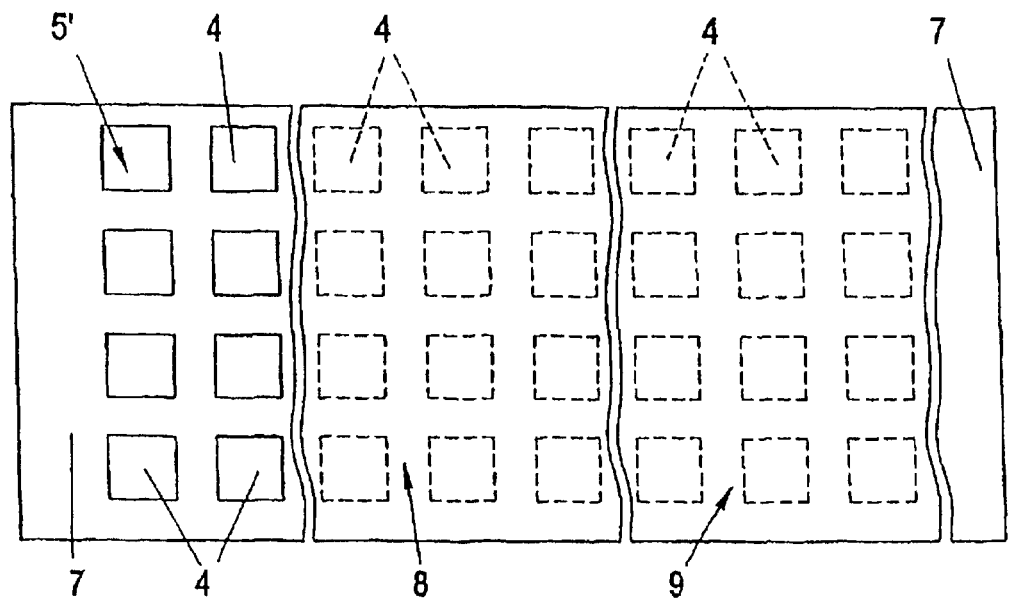
Figure 2D:
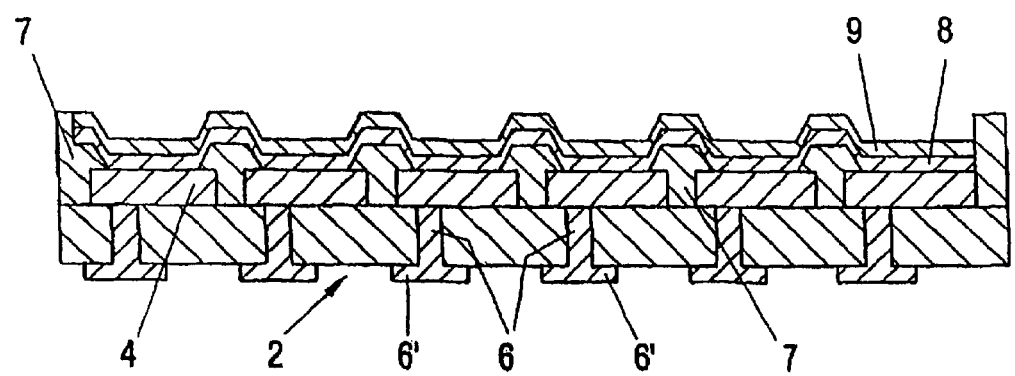
Figure 3A:
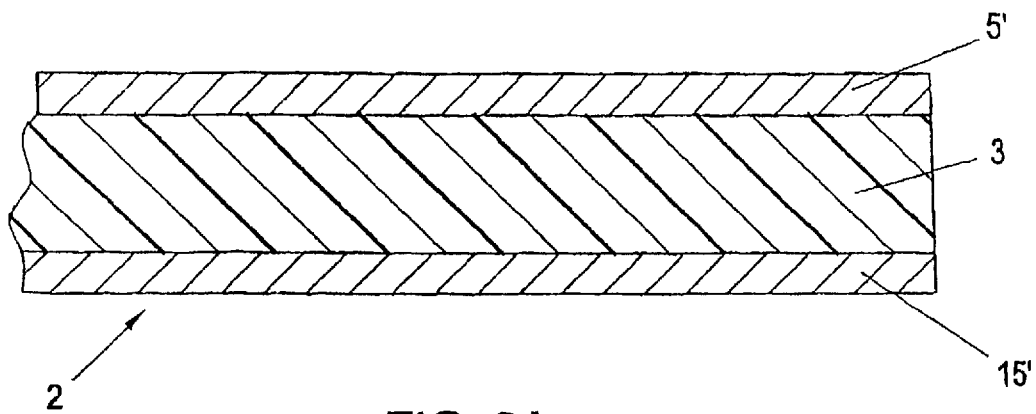
Figure 3B:
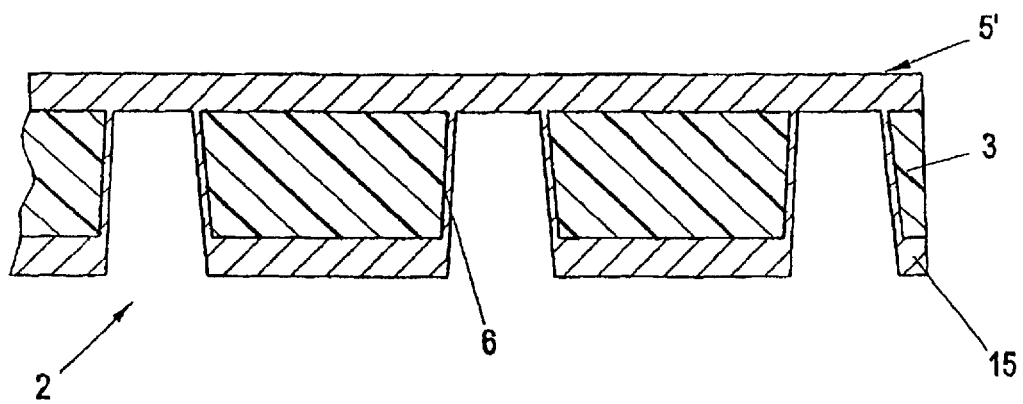
Figure 3C:
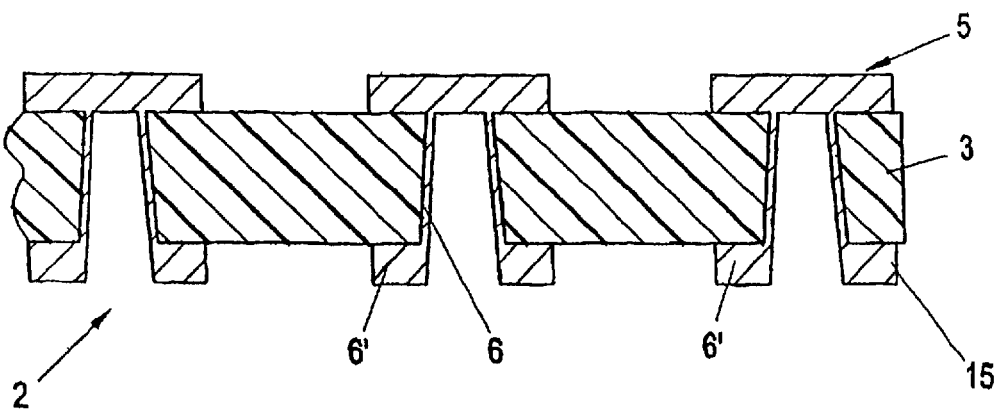
Figure 4A:
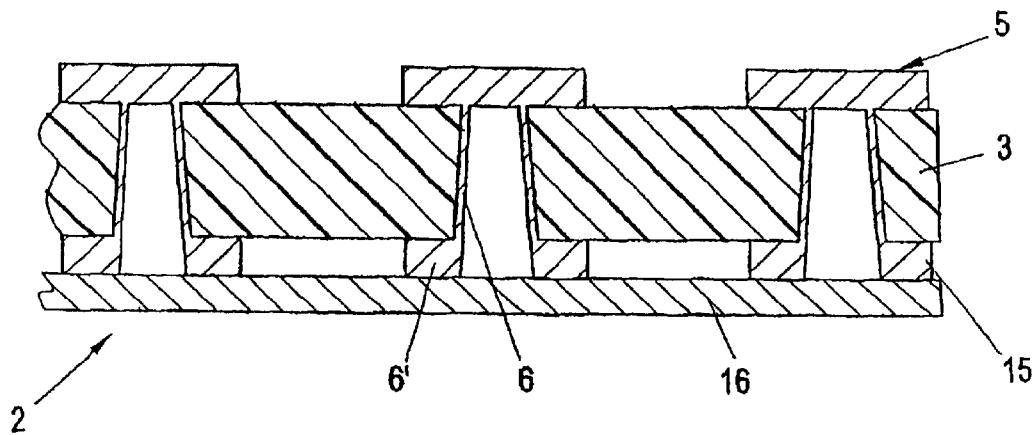
Figure 10:
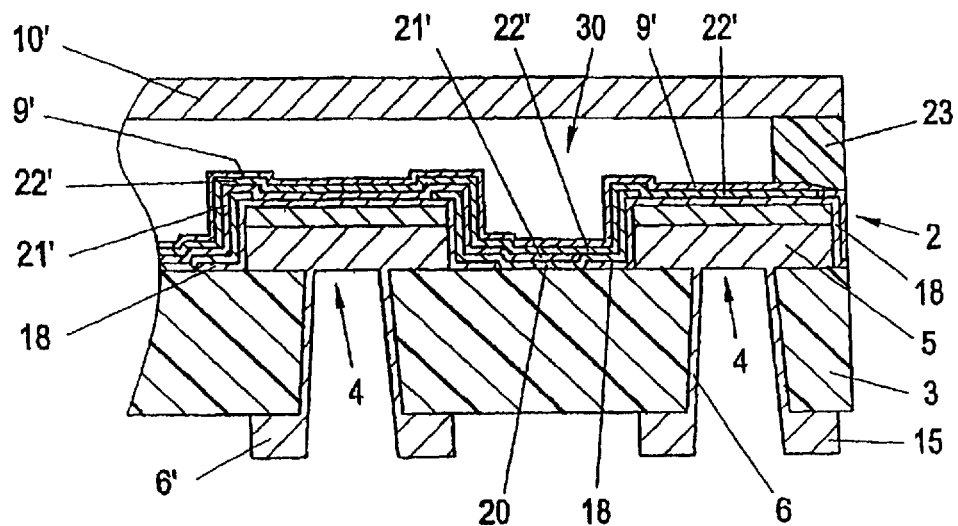
Figure 11:
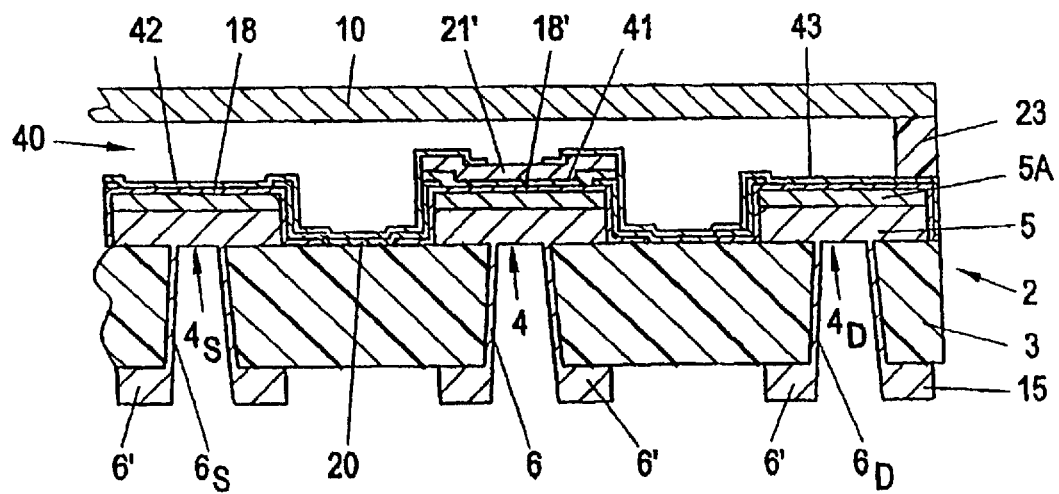
Figure 12:
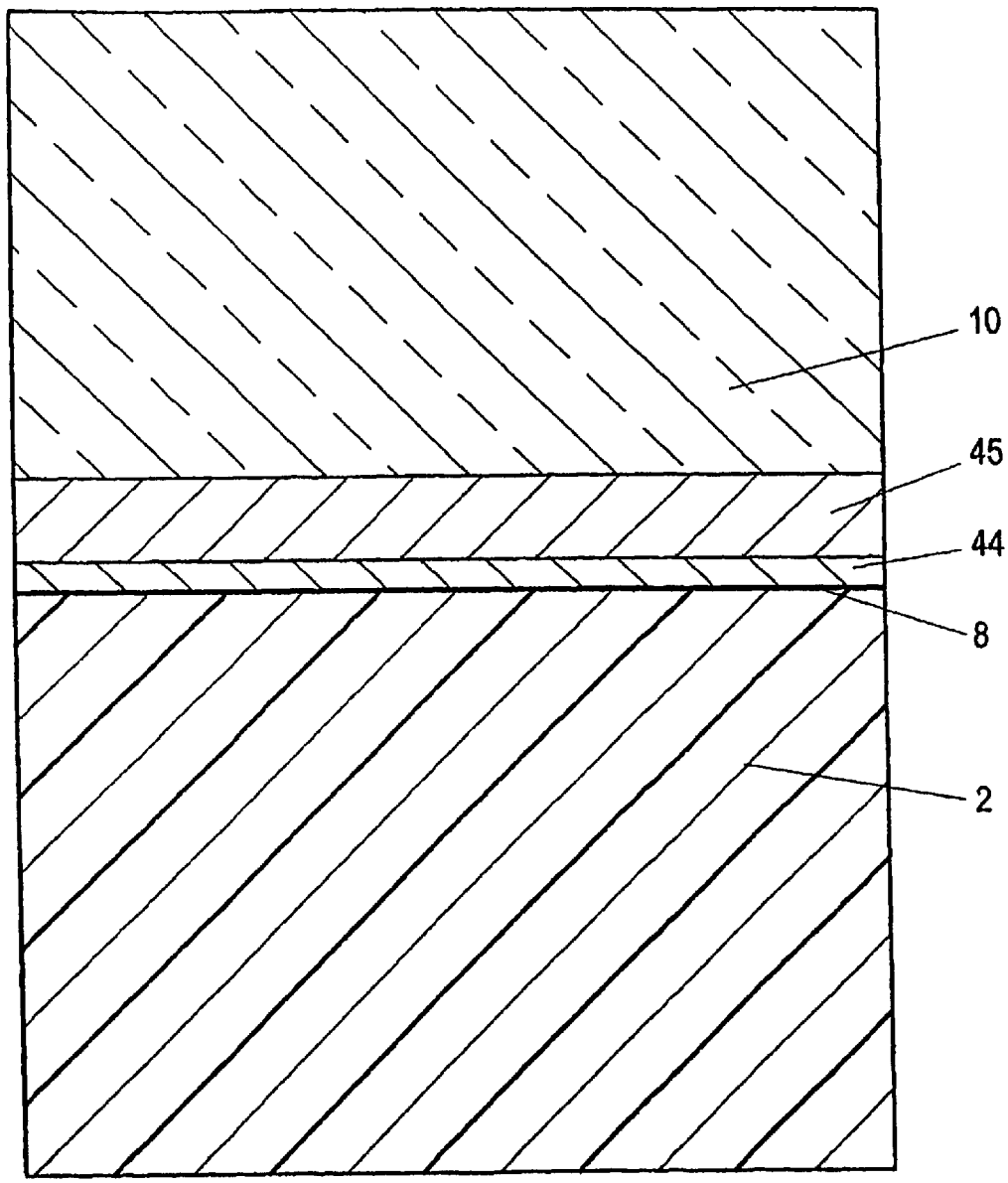
Figure 13A:
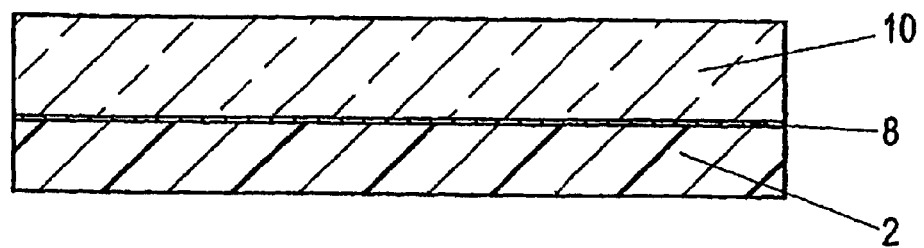
Figure 13B:
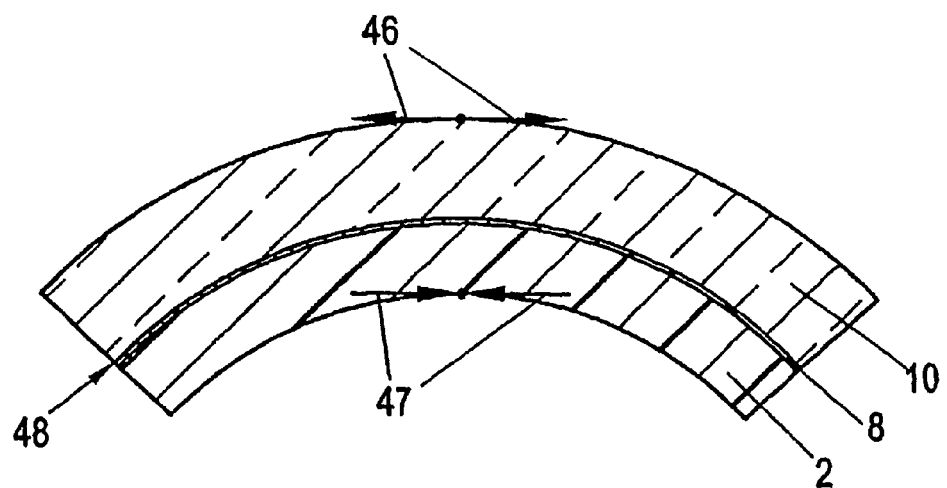
Figure 14:
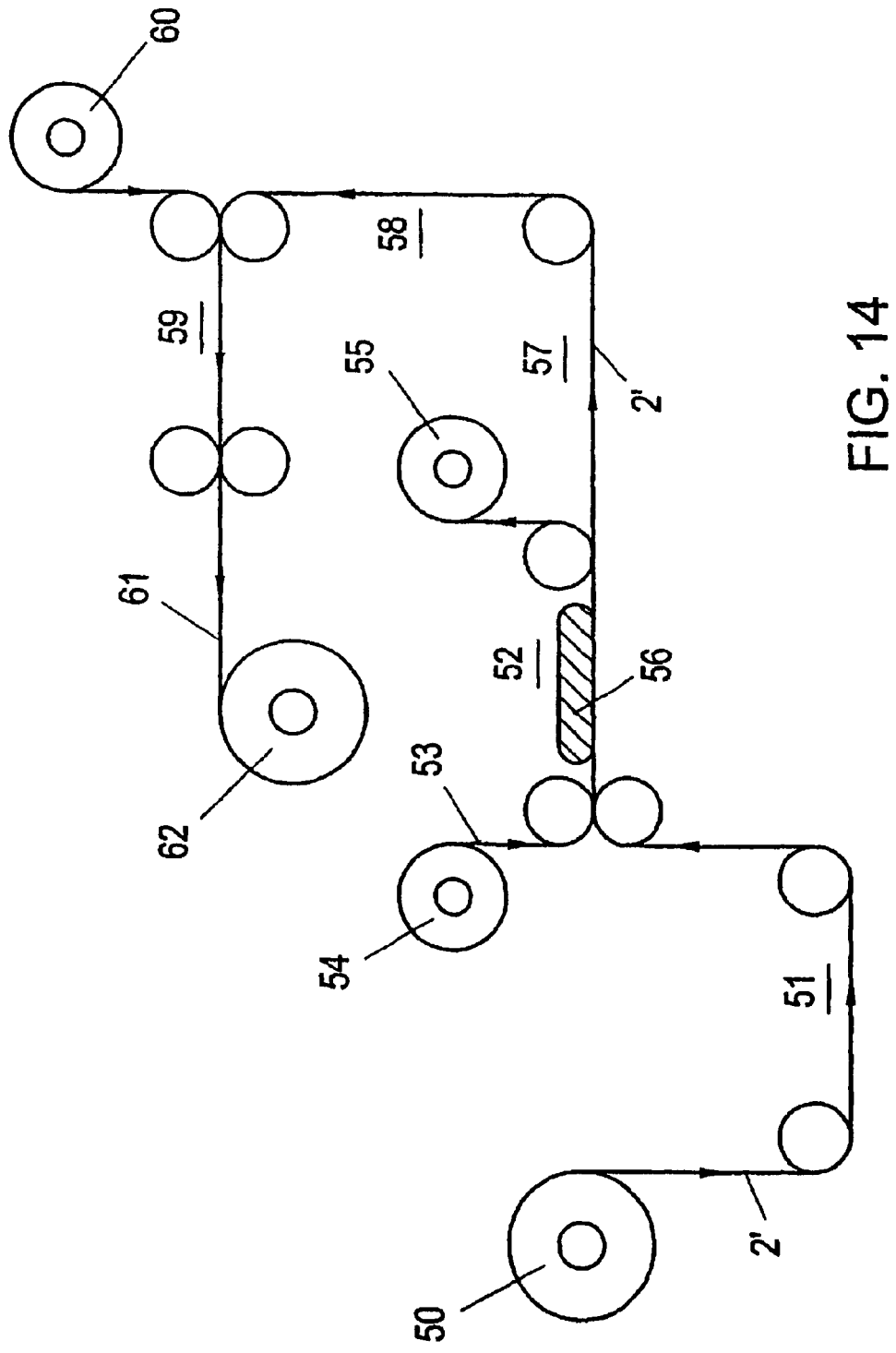
Figure 15:
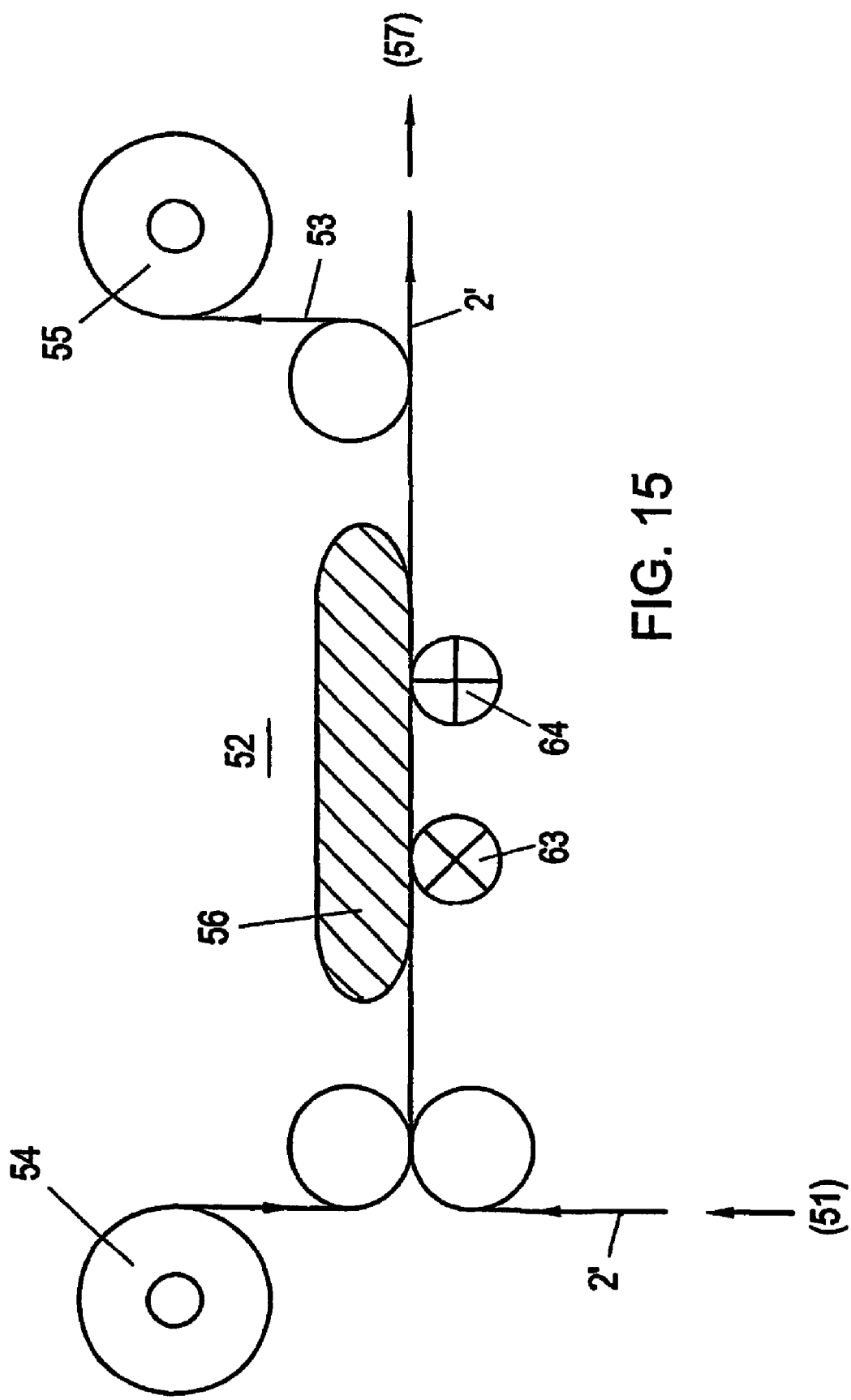

In the following, the invention will be explained in more detail by way of particularly preferred exemplary embodiments, to which it is, however, not to be limited, and with reference to the drawing. The drawing, in detail, represents in:

FIGS. 1A and 1B, a schematic cross-sectional illustration and top view, respectively, of a thin-film assembly constituting an electroluminescent device;

FIGS. 2A, 2B and 2C, schematic top views similar to that of FIG. 1B, of consecutive manufacturing steps of said electroluminescent device;

FIG. 2D, a schematic cross-sectional illustration similar to that of FIG. 1A, yet in an intermediate stage following the manufacturing steps according to FIGS. 2A and 2C and prior to the completion of the device;

FIGS. 3 to 8, in even more detail, the production of such an electroluminescent device departing from a conventional printed circuit board, FIG. 3A being a schematic cross section through such a printed circuit board, FIGS. 3B and 3C illustrating the preparation of this printed circuit board by providing feed-throughs and the photolithographic patterning of its metal coating, and FIG. 4A depicting in a comparable cross-sectional illustration the state after the application of a passivation layer on the lower side of the substrate in preparation for the application of a base electrode reinforcement; FIGS. 4B and 4C depicting in detail the steps of applying a reinforcement on the patterned metal coating (FIG. 4B) and smoothing the electrode surface (FIG. 4C), and the state after the removal of the passivation layer (FIG. 4D); FIGS. 5A to 5C illustrating the application of a resist pattern aimed to produce local contact layers (FIG. 5A), the assembly comprising a deposited contact layer (FIG. 5B) and, finally, the state of the substrate plus base electrodes and contact layers after the removal of the temporary resist pattern (interruption edge) (FIG. 5C); FIGS. 6A, 6B and 6C illustrating consecutive steps during the local, photolitographically assisted application of a patterned passivation layer on the upper side of the substrate; FIGS. 7A, 7B and 7C illustrating the individual steps of applying optoelectronically active organic layers (FIG. 7A), an upper light-permeable contact layer (FIG. 7B) and an upper light-impermeable top electrode (FIG. 7C) for the completion of the thin-film component assembly; FIGS. 8A, 8B and 8C ultimately depicting the final steps of applying an encapsulation for the electroluminescent thin-film assembly by the aid of an adhesive bead (FIG. 8A) to which the encapsulation layer is attached (FIG. 8B), and of integrating laterally patterned color conversion layers (FIG. 8C);

FIGS. 9A to 9D, consecutive production steps for the manufacture of a photovoltaic cell comprising organic, optoelectronic thin-film material;

FIGS. 10 and 11 each a similar schematic cross-sectional illustration of a thin-film assembly comprising an "organic" diode (FIG. 10) and a (field-effect) transistor (FIG. 11), respectively;

FIG. 12, in a schematic cross-sectional illustration, a flexible thin-film assembly comprising a flexible printed circuit board as a substrate and a flexible encapsulation over the thin-film component, wherein the thickness dimensions of the individual layers are shown approximately to scale in their relative relationship;

FIGS. 13A and 13B, a flexible thin-film assembly of this type in a further simplified, schematic cross-sectional illustration, once in the unloaded state (FIG. 13A) and once in the bent state (FIG. 13B), from which it is apparent that, with the thin-film component provided in the neutral plane of the assembly, no tensile or pressure forces act on this thin-film component as they would in the outer regions of the assembly;

FIG. 14, a sketch illustrating the production of a flexible thin-film assembly in a roll-to-roll-process; and FIG. 15, a detailed sketch illustrating the attachment of a temporary stiffening means in the course of a mechanic smoothing and polishing procedure during the production of the flexible thin-film assembly.

FIG. 1A schematically illustrates a thin-film assembly constituting an electroluminescent device 1 in a cross-sectional representation. This electroluminescent device 1 comprises as a substrate a conventional printed circuit board 2 including an insulating base body 3, on which local base electrodes 4 are provided as remnants of the patterned metal coating or conductor layer 5 of the printed circuit board 2. These base electrodes 4 via mechanically or laser-drilled feedthroughs 6 are connected with contact sites 6' provided on the lower side of the substrate, so that appropriate control signals can be applied to the base electrodes 4 from the lower side of the substrate. In FIG. 1B, these base electrodes 4 are, for instance, identifiable as square surfaces, and they are separated from one another by an insulation structure 7 that is grid-shaped in top view.

Above the base electrodes 4 and the insulation structure 7, an organic electroluminescent thin-film structure is applied, particularly in a planar fashion, which thin-film structure may basically be configured as described, for instance, in EP 1 087 649 A or EP 0 854 662 A, the contents of those documents being incorporated herein by reference.

Above the organic electroluminescent layer system 8, a translucent, conductive top electrode 9 is provided, preferably also in a planar fashion and, optionally, in strip form or even in element-form. The whole assembly described so far is closed towards its surroundings by a translucent encapsulation layer 10 while leaving a gas volume 11 below the same, with color converter or index matching layers 12 being further integrated in the encapsulation layer 10 in a manner known per se (cf. EP 0 854 662 A).

From the schematic top view of FIG. 1B it is apparent that these color converter or index matching layers 12 are present in strip-form having, for instance, the primary colors blue, green and red (which is schematically indicated by different hatchings B, G, R in this FIG. 1B). In the line direction (according to the illustration of FIG. 1B), three color points blue, green and red are, thus, always provided one beside the other, the activation of these color points both in the line direction and in the column direction being effected via the feedthroughs 6 by applying appropriate control signals to the respective base electrodes 4. The top electrode 9, on the other hand, can be charged to uniform potential if applied in a planar fashion.

FIGS. 2A, 2B and 2C are schematic top views of different manufacturing steps during the production of the electroluminescent device proper (yet without encapsulation), the intermediate product obtained after these manufacturing steps being apparent from the schematic cross-sectional view of FIG. 2D.

According to FIG. 2A, a laterally structured conductor layer 5' is already available to form a matrix of base electrodes 4. Between these base electrode 4 present in matrix-form is provided the grid-shaped insulation structure 7 which separates the individual base electrodes 4 from one another. In the subsequent step, cf. FIG. 2B, the organic electroluminescent system 8 is planarly applied, cf. FIG. 2D in addition to FIG. 2B. After this, the light-permeable top electrode 9 is deposited—likewise in a planar fashion—so as to obtain the assembly according to FIG. 2D. In this respect, it should be added that the patterning of the conductor layer 5 for the formation of the base electrodes 4 (cf. FIG. 2A) was preceded by a pretreatment of the printed circuit board 2 to make the laser vias 6 plus contact sites 6'.

FIG. 3A in a schematic cross-sectional illustration (in a similar manner, all other Figures are schematic cross-sectional illustrations) depicts a printed circuit board 2 comprising a double metal coating 5 (on the upper side) and 15 (on the lower side) respectively provided on a dielectric base body 3 made, e.g., of epoxy resin. The metal coatings 5, 15 are, for instance, made of copper, as usual.

The printed circuit board 2, which constitutes the substrate of the present thin-film assembly, is then provided with feed-throughs 6 in a first step, cf. FIG. 3B, said feedthroughs, in view of the close pixel adjacency desired, i.e. the high resolution capacity of the electroluminescent device 1 to be produced, being made as laser bores having bore walls with galvanic copper coatings. In this respect, such a feedthrough or laser bore 6 is preferably produced below the respective base electrode 4 to be provided, in order to enable the finally obtained, narrow matrix arrangement of the base electrodes 4 to be designed with a suitable controllability from the lower side of the substrate.

The next step according to FIG. 3C comprises the photolitographic patterning of the metal coatings, i.e., the conductor layers 5, 15 on the upper and lower sides of the base body 3 of the printed circuit board 2. Such patterning is likewise conventional per se, so that the subsequently obtained structure can be illustrated in FIG. 3C without the usually implemented intermediate steps. In order to distinguish the full-surface conductor layers, the respectively obtained upper and lower conductor layer structures are now denoted by 5 and 15 rather than 5' and 15', respectively. The remaining parts 15 of the conductor layer now form the contact sites 6' on the lower side.

After this, a temporary passivation layer 16 is applied to the lower side of the substrate, as is apparent from FIG. 4A. This temporary passivation layer 16 serves to temporarily passivate these lower-side regions of the printed circuit board 2 in view of the subsequent application of a chemical or electrochemical reinforcement of the conductor layer 5 on the locations of the base electrodes 4 to be produced. This passivation layer 16 can be applied photolitographically in a manner known per se.

Figure 4B:
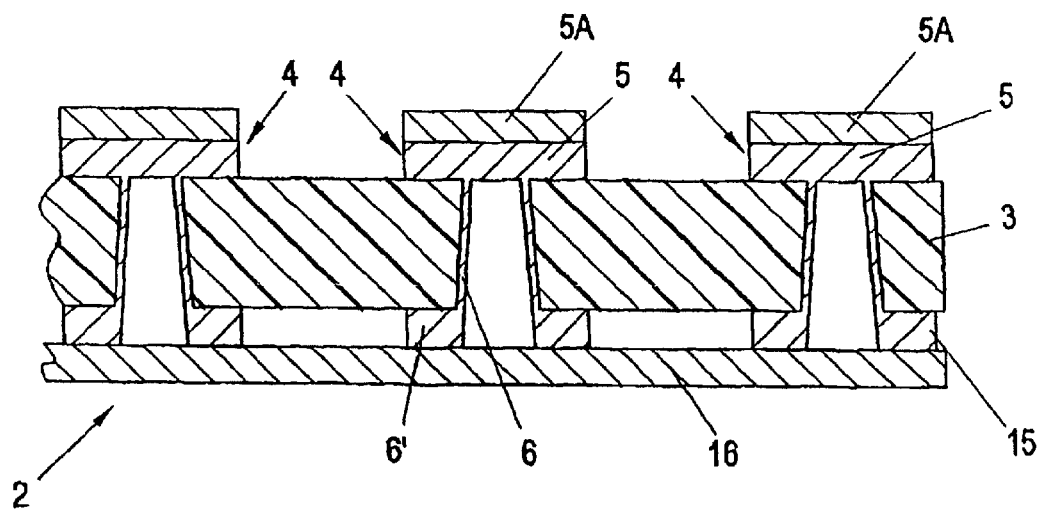
Figure 4C:
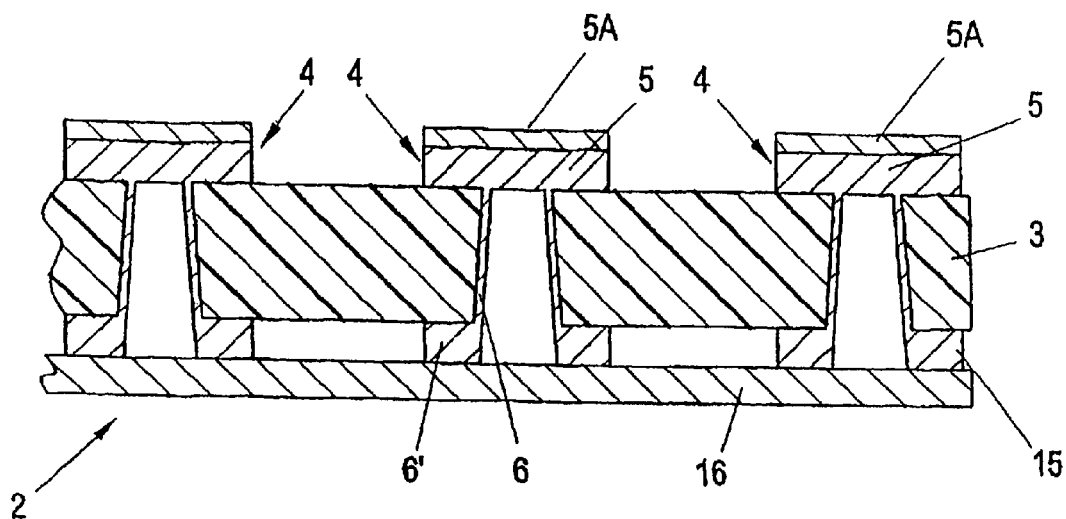

As already indicated, the subsequent step comprises the chemical or electrochemical reinforcement of the patterned conductor layer 5, the reinforcement layers being shown in FIG. 4B at 5A. This metallic layer 5A, together with the patterned conductor layer 5, forms the respective base electrodes 4, for instance in the matrix arrangement according to FIG. 2A. These base electrodes 4 are, however, not yet suited to build up of the desired active or passive electronic thin-film components, i.e., the optoelectronic EL-device 1 in the instant case, since the surface of the conductor layer 5 as such is much too rough, as is the surface of the conductor layer 5 provided with the reinforcement 5A. The following step, therefore, comprises the smoothing and/or polishing of the base electrodes 4 in order to attain a low surface roughness, for instance a maximum mean surface roughness of 10 nm or, preferably, even 3 nm. This smoothed state is illustrated in FIG. 4C. Smoothing and polishing may be effected in a conventional manner such as, for instance, mechanically, chemically, electrochemically, chemomechanically or by ion etching. It goes without saying that combinations of these processes are feasible too.

The surface roughness to be created depends, of course, on the type of the respective application, i.e. on the respective thin-film component to be applied, so that deviations from the above-mentioned mean roughness values are conceivable as well.

It should also be noted that it is not necessarily required to provide a metallic reinforcement 5A for the base electrodes 4, because also the metal coating, i.e. the conductor layer 5, of the printed circuit board may already be sufficiently thick. It may, furthermore, be basically contemplated to change the order of conductor layer patterning (cf. FIG. 3C) and conductor layer surface smoothing (cf. FIG. 4C), i.e. to realize the smoothing of the conductor layer 5' first and photolithographically etch the conductor layer 5' in a suitable manner only after this in order to form the base electrode 4, i.e. the patterned conductor layer 5.

Figure 4D:
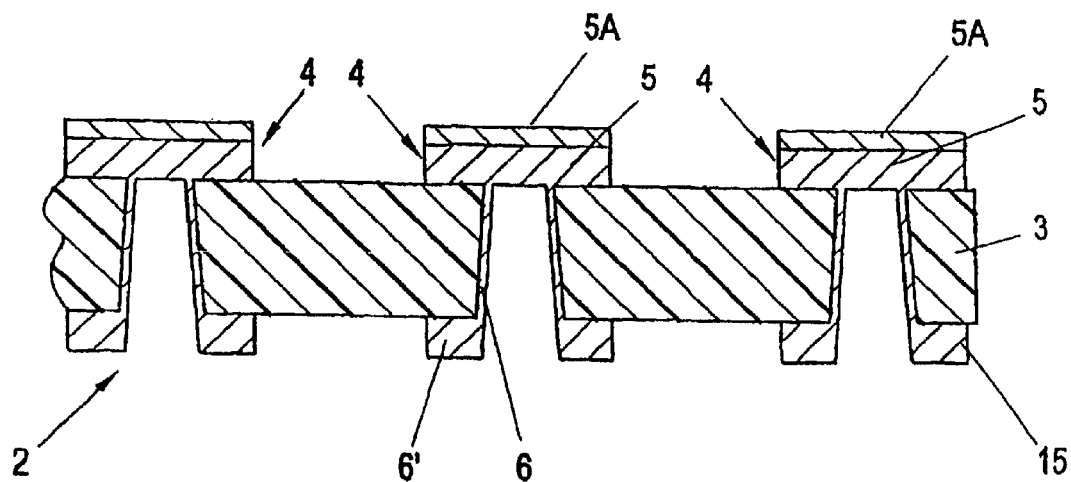

In a step completing the production phase, the lower passivation layer 16 is removed such that the substrate structure according to FIG. 4D will be obtained.

Figure 5A:
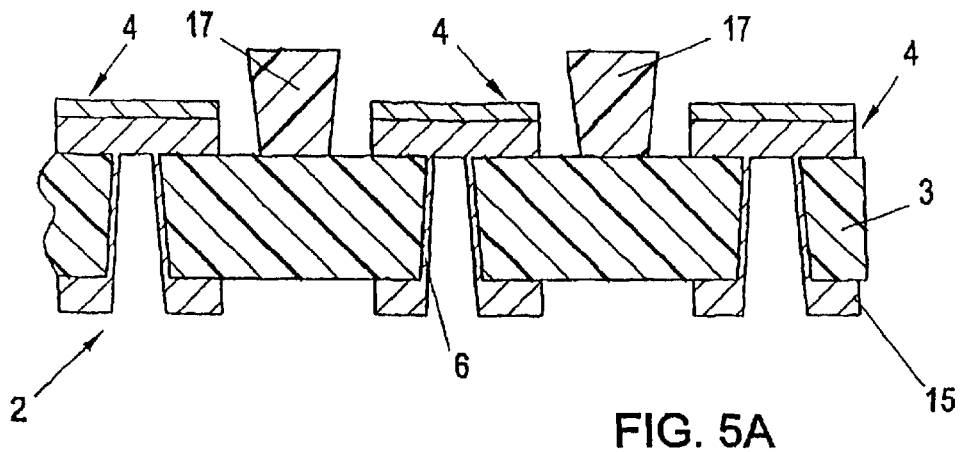
Figure 5B:
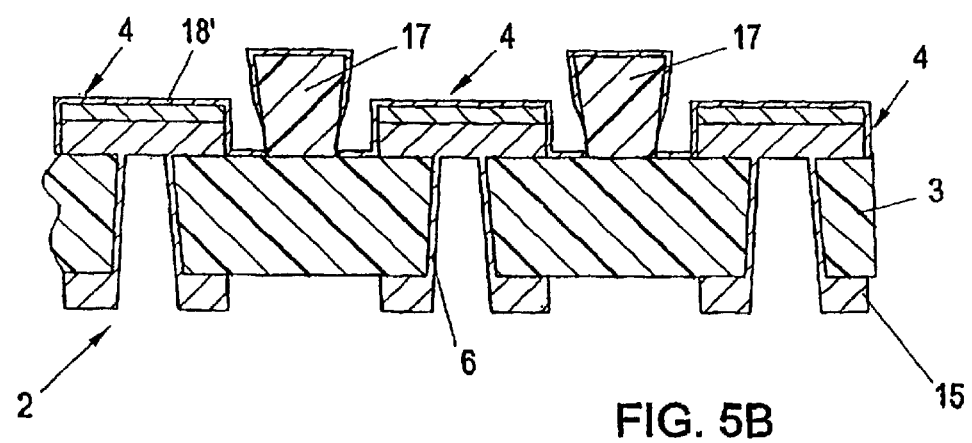
Figure 5C:
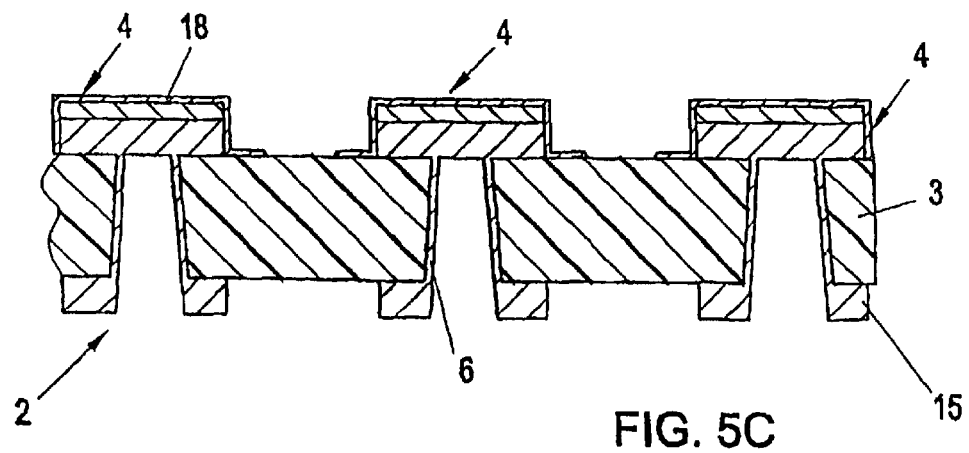

In the following phase, a contact layer is applied to the now smoothed base electrode 4, a temporary resist structure in the form of interruption edges 17 being at first provided in the spaces between the base electrodes, as in accordance with FIG. 5A. After this, all of the upper surface of the obtained structure is coated with a layer 18' of contact layer material, whereby no contact layer material is applied in the lower regions of the interruption edges 17 such that in a subsequent removal step (etching step) the interruption edges 17 can be removed, with the desired contact layer 18 being left in the remaining surface regions, cf. FIGS. 5B and 5C.

The contact layer 18 serves for the electric contacting of the following layer to be applied next, of the respective thin-film package as well as to stabilize the adherence of this thin-film package on the base electrode 4 and, finally, also to passivate the conductor layer 5 or its reinforcement 5*a* by preventing, through the introduction of the contact layer 18, any possible contamination of the thin-film system by the inter-diffusion of foreign substances from the conductor layer 5 or its reinforcement 5*a*, respectively. The material for the respective contact layer 18 naturally is again to be selected depending on the respective thin-film component to be applied and consists, for instance, of a metal such as aluminum, gold, palladium or platinum, a metal alloy, carbon or a semi-conducting compound, yet may also be comprised of a conductive suspension or solution (e.g. polyaniline, polyethylene dioxithiophene/polystyrenesulfonic acid.

The contact-material coat 18' may be applied by means of common thin-film procedures such as, for instance, by thermal evaporation, cold cathode sputtering, electron beam evaporation, coating by means of laser pulses as well as by coating methods from the liquid phase such as, e.g., dipping, spraying, spinning and ink-jet printing methods, whereby the physical or chemical adsorption of the contact material on the conductor layer 5 or its reinforcement 5*a* is to be ensured; this physical or chemical adsorption is of relevance to the adherence or non-detachment of the contact material on or from the conductor layer 5, 5*a*. With uniform coating methods from the liquid phase, the lateral patterning of the contact layer 18 may be effected, for instance by dry etching procedures, after having coated the conductor plate 2. If such processes are applied, patterning by the interruption-edge method may be omitted.

Subsequently, the application of an upper passivation layer is effected to passivate the zones between the base electrodes 4 plus contact layers 18 arranged thereabove, thus preventing the penetration of substances from the base body 3 of the printed circuit board 2 via those zones into the yet to be applied thin-film package of the respective thin-film component. To this end, a new, temporary resist structure 19 is applied on the contact layers 18 above the base electrodes 4 in a first step according to FIG. 6A, after which the material for the passivation layer 20 is deposited, cf. FIG. 6B. Following this, the resist layer plus passivation layer are photolithographically removed from above the base electrodes 4 such that a patterned passivation layer 20 will only remain in the intermediate zones where the base material of the insulation base body 3 of the printed circuit board 2 has been exposed, cf. FIG. 6C. Via windows 20' provided in this passivation layer 20, the contact layers 18 lie bare together with the base electrodes arranged therebelow. The passivation layer 20 is, of course, only suitable, or to be applied, if the addressed contamination of the specific thin-film package by substances that may diffuse out of the dielectric material of the base body 3 is to be feared. Where such a diffusion of substances is not to be feared, the application of the passivation layer 20 may be obviated, but then another insulation structure (7 in FIGS. 1A and 1B) would have to be provided between the base electrodes 4. The material of the passivation layer 20 again is to be chosen as a function of the materials employed and, in particular, the material of the base body 3. As described above, it is suitably patterned by way of photolitography (cf. FIGS. 6A and 6B), and the material of the passivation layer 20 can be applied by common thin-film techniques such as by thermal evaporation, cold cathode sputtering etc., with the physical or chemical adsorption of the passivation material on the base body 3 to an extent sufficient for adherence having to be ensured. The material for the passivation layer 20 may, for instance, comprise silicon oxide, a sol-gel system or an epoxy compound.

Figure 6A:
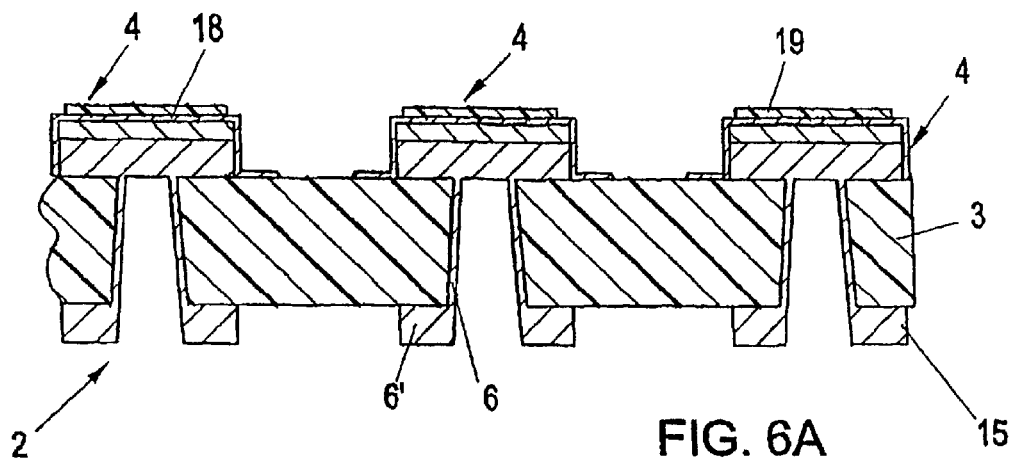
Figure 6B:
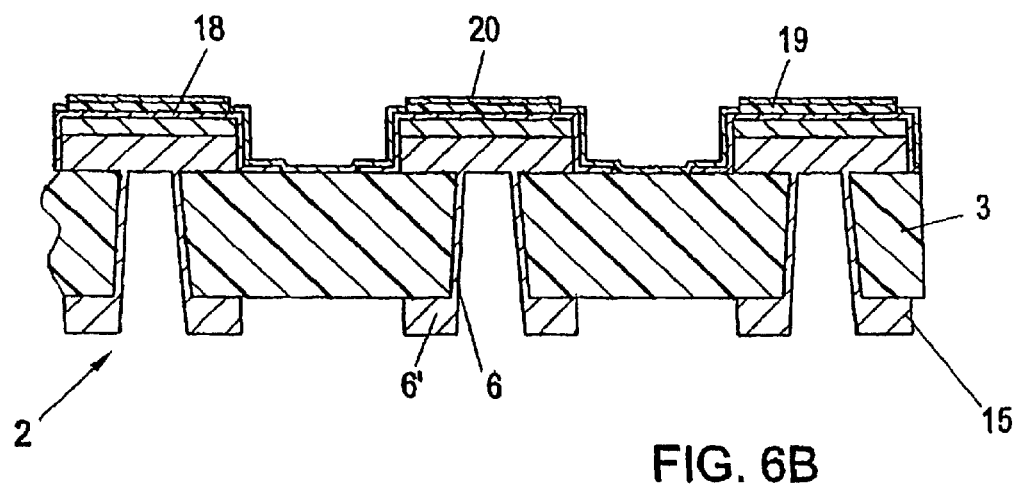

As an alternative to the technique according to FIGS. 6A to 6C, it is also feasible to previously provide a full-surface, uniform application of passivation material, for instance in laminate form, and only subsequently pattern this passivation layer photolitographically in order to finally obtain the structure according to FIG. 6C.

Figure 6C:
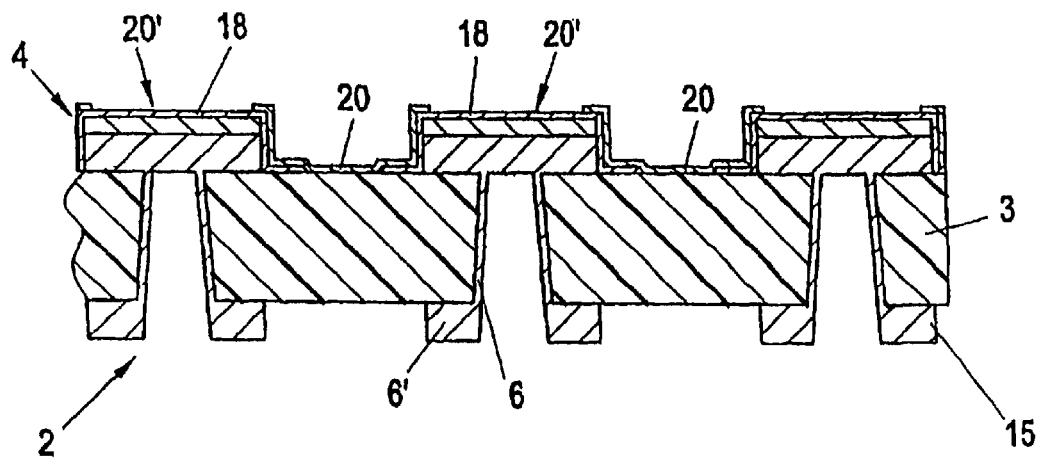
Figure 7A:
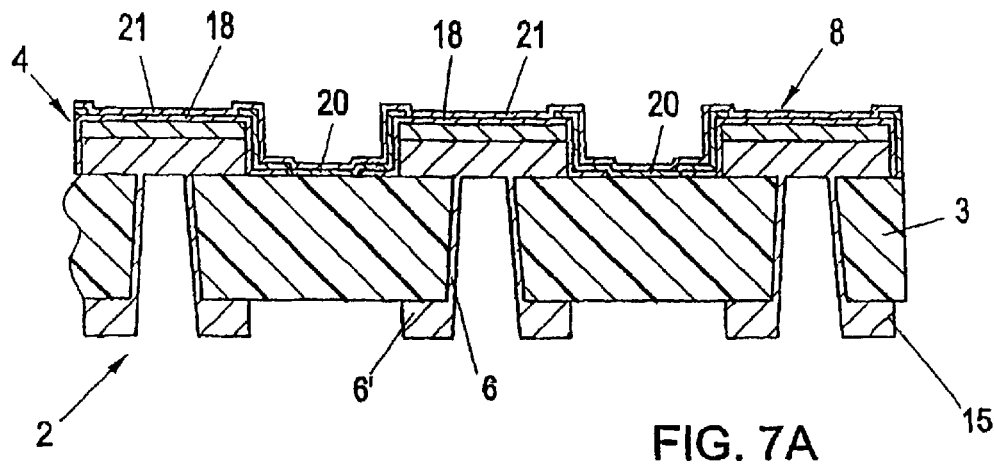
Figure 7B:
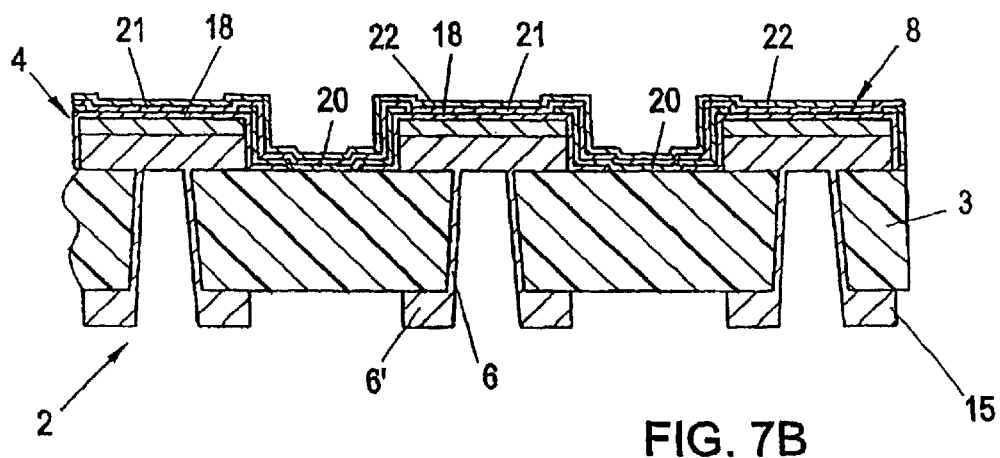
Figure 7C:
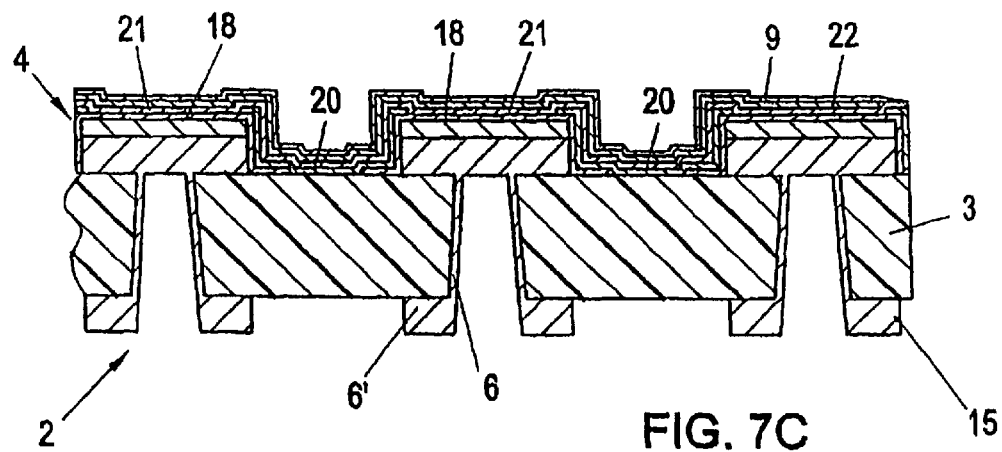

The thus obtained assembly is now ready for the application of the respective electronic layers by thin-film technology in order to build up the desired thin-film component 8 which, in the instant case, constitutes an optoelectronically active, organic thin-film structure; in order to obtain the electroluminescent (EL) device 1 (cf. FIG. 1A), one or several optoelectronically active organic layers 21 are deposited on the prepared substrate according to FIG. 6C so as to obtain the assembly according to FIG. 7A. As is apparent, the organic EL-material is, for instance, deposited over the total surface area, which renders the production particularly simple. In the same manner as the (optionally multilayer) organic EL thin-film system 21 (whose thickness may range from a few nm to some hundred nm), a transparent or translucent contact layer 22 is subsequently applied in a planar fashion, cf. 7B; the subsequently applied transparent or translucent top electrode 9, too, is planarly applied, cf. FIG. 7C. As a variation, it is, however, also feasible to pattern the upper contact layer 22 as well as the top electrode 9 strip-wisely or symbol-wisely rather than holohedrally.

Examples of organic optoelectronically active layer materials used to realize the electroluminescent device 1 may comprise poly- and oligophenyls, arylamines, poly- and oligoazomethines. For the transparent or translucent contact layers 22 as well as the top electrodes 9, transparent or semitransparent metals, metal alloys, semi-conductor compounds (having layer thicknesses of <50 nm), conductive metal oxides (e.g., aluminum-doped zinc oxide, zinc-doped indium oxide etc.), conductive sol-gel systems and/or conductive suspensions and solutions (based on polyaniline, polyethylene dioxithiophene/polystyrenesulfonic acid) may be used.

Figure 8A:
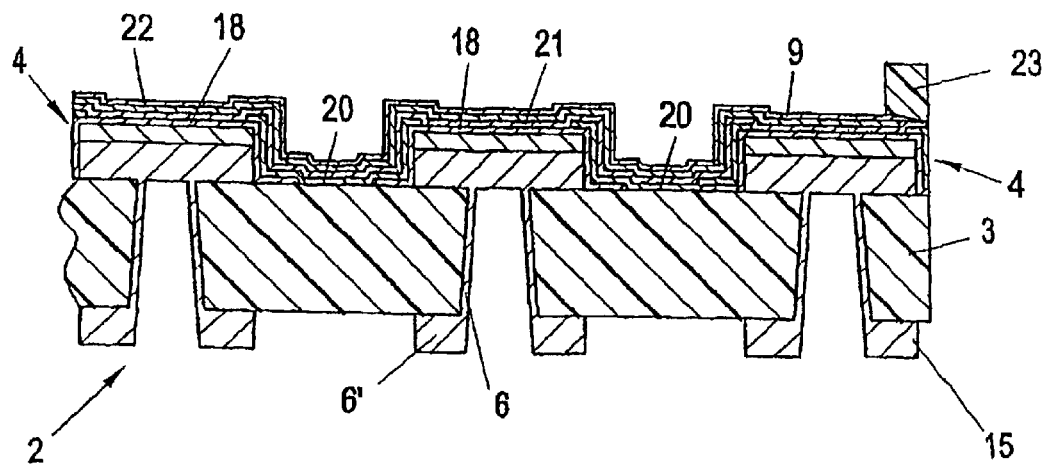
Figure 8B:
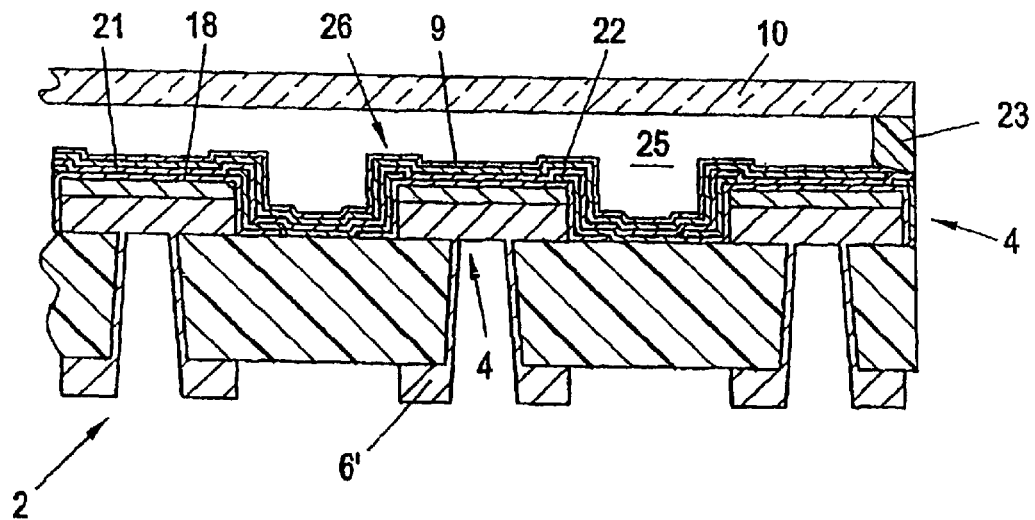

Finally, the thus obtained thin-film assembly (cf. FIG. 7C) is additionally provided with a protective cover, to which end an adhesive bead 23 that is impermeable to gas and moisture is, at first, peripherally applied (cf. FIG. 8A). On top of said adhesive bead 23, a light-permeable encapsulation layer 10 is subsequently applied to encapsulate the thin-film components 26 proper, which comprise the base electrodes 4, the contact layer 18, the thin-film structure 8, the upper contact layer 22 and the top electrodes 9, with a gas volume 25 being left, in which getter materials for oxygen and/or water or moisture may be contained in a manner known per se.

Figure 8C:
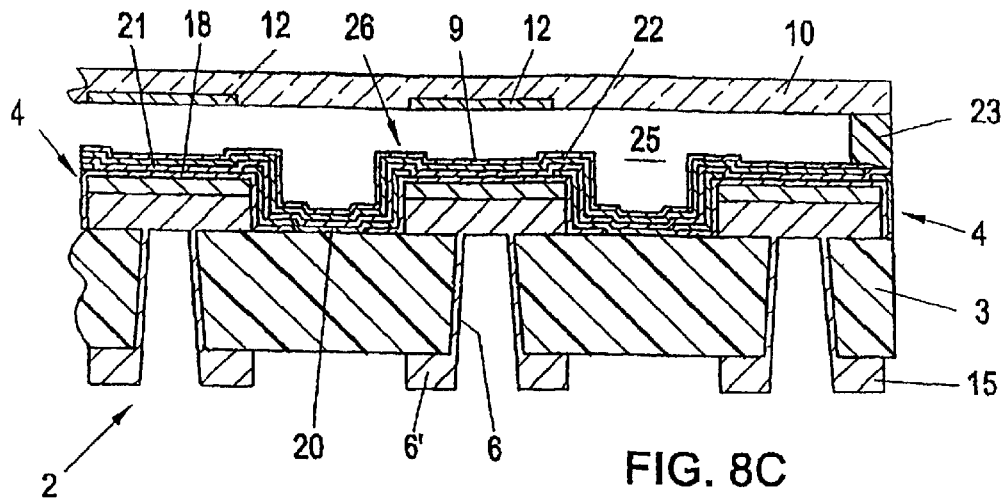

As illustrated in FIG. 8C, laterally patterned color conversion layers 12 (cf. also FIGS. 1A and 1B besides FIG. 8C), too, may be integrated in the encapsulation layer 10 above the gas volume 25 and the individual thin-film components 26, if desired.

In this manner, the desired thin-film assembly has now been completed and may be provided with the required control connections on the contact sites 6'. In order to realize desired control functions, additional components may be mounted on this printed circuit board 2 in a manner known per se and not illustrated in detail.

FIGS. 9A to 9D by way of different production steps illustrate another exemplary embodiment, namely a thin-film assembly comprising a photovoltaic cell made of an organic, optoelectronically active layer system, the production of which is basically feasible in a manner very similar to that described above with reference to FIGS. 3A to 8C.

Figure 9A:
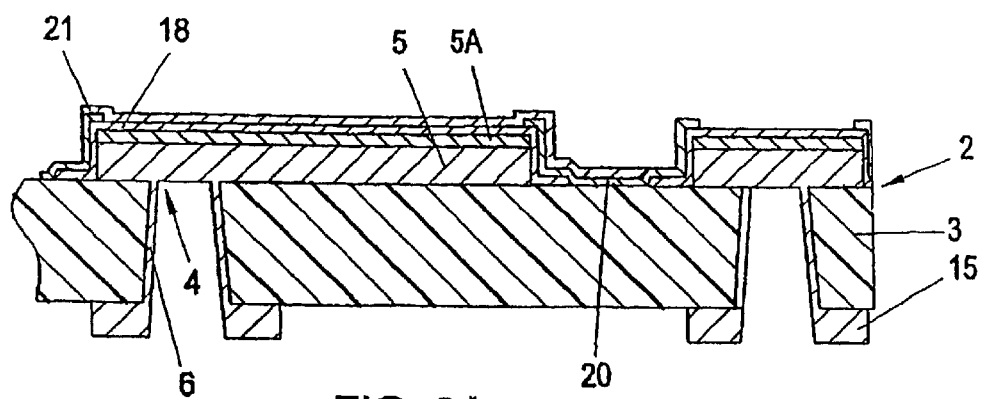
Figure 9B:
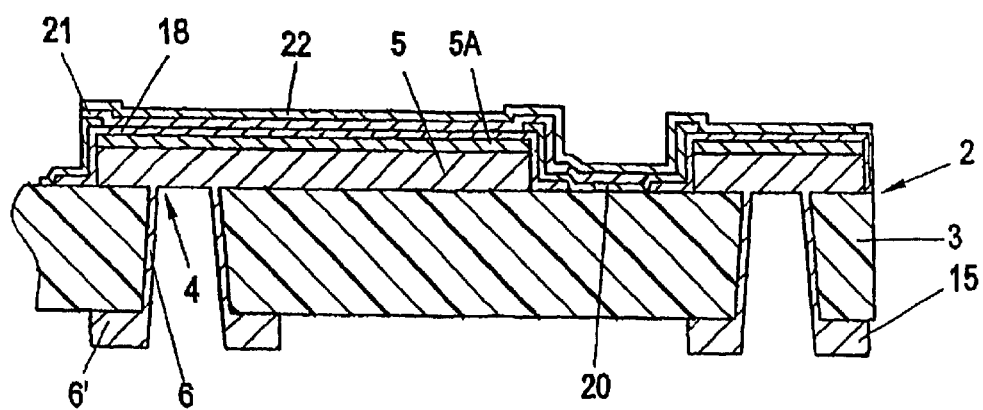
Figure 9C:
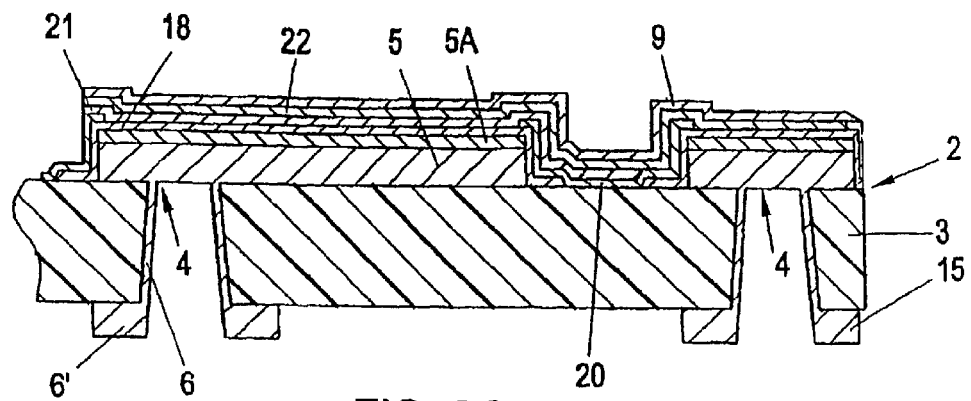
Figure 9D:
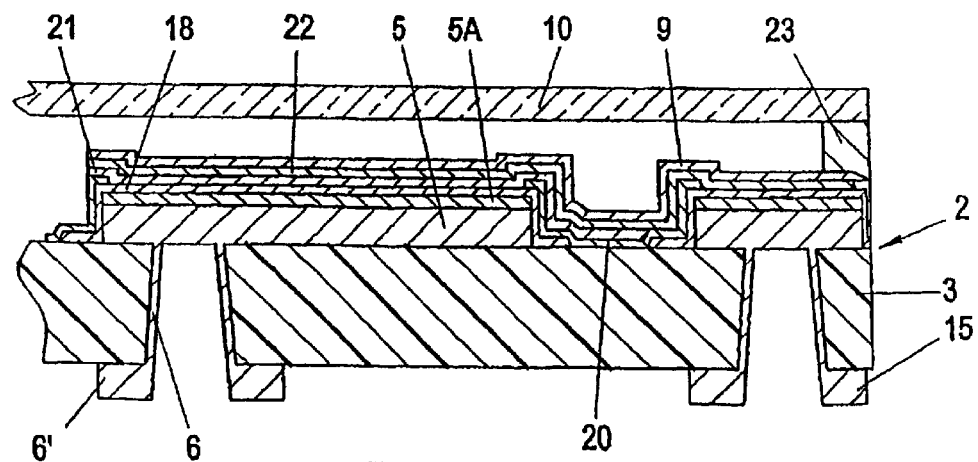

In detail, the desired optoelectronically active, organic layer system 21 is deposited on appropriate base electrodes 4 each comprised of the patterned conductor layer 5, a reinforcement 5A and a contact layer 18, in a manner similar to that elucidated in FIG. 7A, whereupon a light-permeable contact layer 22 (cf. FIG. 9B), and, on that, a light-permeable top electrode 9 (cf. FIG. 9C) may again be planarly deposited. Finally, again in a manner as previously explained by way of FIGS. 8A and 8B, a light-permeable encapsulation layer 10 with a peripheral gas and moisture-impermeable adhesive bead 23 may be attached as illustrated in FIG. 9D.

FIG. 10 illustrates another exemplary embodiment in the form of an organic diode 30 integrated in a printed circuit board 2, wherein an appropriate organic diode thin-film system 21' is again applied above a base electrode 4 including a contact layer 18 in a manner comparable to that explained above. On top, there is an upper contact layer 22', which in this case need not be light-permeable, and a top electrode 9', which need not be light-permeable either. From FIG. 10 are, moreover, apparent the patterned lower metal coating 15 and the base body 3 of the printed circuit board 2 as well as, furthermore, a tight adhesive bead 23 and an encapsulation layer 10', with an opaque configuration being feasible also in this case.

Something similar holds for the transistor structure 40 according to FIG. 11, wherein a contact layer 18' is again applied above the base electrode 4, which is comprised of a patterned upper conductor layer 5 and a reinforcement 5A, said contact layer 18' forming, for instance, the gate contact of the field-effect structure 40 formed. Above this contact layer 18' of the transistor structure 40, in insulation layer 41 of, for instance, aluminum oxide is disposed, on which an organically active layer 21' is, in turn, applied, which communicates with a source contact layer 42, on the one hand, and a drain contact layer 43, on the other hand. These contacts are contacted from below via base electrodes $4_S$, $4_D$ arranged laterally of the transistor structure 40, and their respective feedthroughs $6_S$, $6_D$ and contact sites 6', respectively.

In a similar manner, other thin-film components, namely both active and passive components, may as well be built up directly on the printed circuit board substrate 2, or integrated in the same, whereby it is essential to carry out the respective smoothing of the patterned, optionally reinforced conductor layer 5 (and 5A, respectively) and, hence, of the base electrodes 4 or lower-side electrodes. The described contact layer intended to establish the contact and stable adhesion between the thin-film structures is then applied on that smoothed or polished base electrode. Other components which are conventional per se and may be integrated in printed circuit boards by the technique according to the invention include, for instance, sensors, wherein the respective light-permeable upper contact layers, electrodes and encapsulation layers will have to be provided in the event of optical sensors.

The previously explained techniques may be applied both with rigid printed circuit boards and with flexible printed circuit boards in a substantially identical manner. Such flexible printed circuit boards 2 comprise, for instance, an insulating base body 3 of a flexible polyimide, polyethylene naphthalate, polester or polyether etherketone film, and, in a comparable manner, a metal layer, particularly of copper, may be provided on one or both sides as a conductive layer 5.

In order to finally obtain an altogether flexible overall assembly, virtually no modifications in respect to the previously described techniques are required for the application of the thin-film structure 8 as well as the contact layers 18 and the top electrodes 9, the—extremely thin—thin-film systems 8 in an advantageous manner being particularly suitable for such flexible structures, yet an adaptation will be necessary to the extent that it has to be ensured for the encapsulation 10 that no rigid glasses are glued on, but flexible thin glass laminates or even polymer-oxide composite layer systems or similar flexible encapsulation layers 10 are inserted.

Such an encapsulation layer 10 of a flexible material can be applied on the flexible printed circuit board 2, or the thin-film system 8 attached thereto, via an adhesive intermediate layer 44 as well as a passivation layer 45 acting as a barrier layer against moisture and air, as is schematically illustrated in FIG. 12. In the illustration according to FIG. 12, care has by the way been taken to represent the relative thickness ratios as true to scale as possible, from which results that the thin-film component 8 comes to lie in the neutral plane of the over-all flexible thin-film assembly. This will be approximately in the central plane of the overall assembly, depending on the material and shape of, above all, the encapsulation layer 10 as well as the flexible printed circuit board 2.

Such a thin-film assembly of flexible nature is once again illustrated, in an even more simplified form, in FIG. 13A, and in FIG. 13B this thin-film assembly is shown in a bent or partially folded state. In the latter case, tensile forces act externally on the material in the bending zone, as is illustrated in FIG. 13B by arrows 46, whereas pressure forces indicated by arrows 47 in FIG. 13B act internally in the bending zone. The neutral plane 48, in which the thin-film system 8 is preferably arranged, remains substantially free of forces during bending such that no tensile or pressure forces will occur within the thin-film component 8 itself, if the whole assembly is subjected to bending.

FIG. 14 schematically indicates the production of thin-film assemblies with flexible printed circuit boards in a so-called roll-to-roll process. Therein, a flexible metal-clad base material such as, e.g., a copper-clad polyimide film is supplied as a flexible printed circuit board sheeting 2' from a starting reel to a process chamber or station 51, where photolitographic patterning is carried out and the reinforcement 5A of the metal coating 5, i.e., the conductor layer is applied as previously described.

The sheeting material 2' is then fed via rollers to a process chamber or station 52, where the metal coating 5, 5A is smoothed and/or polished. Before entering this process chamber 52, the flexible printed circuit board sheeting 2' on its rear side may be stiffened by the aid of a flexible carrier foil 53, which is unwound from a reel 54. After having left the process chamber 52, this flexible carrier foil 53 providing temporary stiffening can be wound up on a reel 55. It goes without saying that the carrier foil 53 may, however, also be removed at a later stage of the manufacturing process.

During the smoothing or polishing procedure, the sheeting material 2' may optionally also be guided over a flat table 56 within the process chamber 52 in order to ensure a particularly effective stiffening or support of the sheeting material 2'.

The sheeting material 2' then enters a process area or process chamber 57, where the polished metal coating 5, 5A is finished (contact layer 18) and passivated (passivation layer 20), as has been explained in principle above, for instance, by way of FIGS. 4 to 6.

In a process station or chamber 58, the coating of the flexible printed circuit board 2 with the (active or passive) thin-film layers, e.g. 21, with the upper and, for instance, light-permeable contact layer 22, and with the optionally likewise light-permeable top electrode 9 completing the thin-film component is accomplished. The active (or optionally passive) thin-film layers may again be comprised of organic or inorganic materials as known per se.

Finally, the flexible printed circuit board 2, i.e. the sheeting material 2', can be coated in a process station 59 with encapsulation layers 10, which are preferably wound off a reel 60 as a sheeting material, fed to the flexible printed circuit board 2' and laminated thereon. At last, the thus obtained sheeting material 61, i.e. the flexible thin-film assembly comprising a flexible printed circuit board and a flexible encapsulation, is wound on a reel 62 so as to be kept ready for subsequent cutting or contouring steps.

As already pointed out above and explained with reference to FIGS. 13A and 13B, it is advantageous if the encapsulation 10 is devised such that the thin-film component comes to lie in the neutral plane 48 as the encapsulation layer is being laminated onto the flexible printed circuit board sheeting in the process station 59. It is thereby ensured that the thin-film system 8 will virtually not be exposed to any mechanical stress during the subsequent bending of the overall system, thus avoiding delaminations and fractional cracks.

FIG. 15 illustrates the mechanical smoothing and polishing procedure in the process station 52 in more detail, with smoothing and polishing rolls 63 and 64, respectively, or the like being schematically indicated, too. As already mentioned, the flexible printed circuit board 2' is stiffened on its rear side with a temporary carrier film 53, and it is, moreover, guided over a flat polishing table 56 that serves as a support for the smoothing or lapping and polishing rolls or discs 63, 64. As already indicated, the carrier foil 53 can be removed again immediately after this smoothing procedure, or it may be carried off the printed circuit board sheeting 2' also at a later point of time.

The invention claimed is:

1. A thin-film assembly comprising a substrate, said substrate being comprised of a printed circuit board including an insulation-material base body and a metal lamination as a conductor layer, wherein the insulation-material base body comprises an insulation material selected from the group consisting of epoxy resin, polyimide, polyethylene naphtalate, polyester or polyether etherketone, and including at least one electronic component applied on the substrate, wherein a base electrode formed by the conductor layer is provided on the substrate, on which base electrode layers belonging to the component and including an upper cover-electrode are arranged, wherein the component is applied by thin-film technology, and the conductor layer is smoothed at least on the location of the thin-film component, wherein the smoothed conducter layer over surface areas having the dimensions of $20\times20$ $\mu m^2$ (micro-roughness), exhibits a maximum mean surface roughness of 10 nm and a contact layer is applied by thin-film technology between the smoothed, optionally reinforced, conductor layer and the superimposed thin-film layers of the thin-film component, which contact layer is physically or chemically adsorbed directly on the surface of the base electrode, wherein the contact layer is arranged to passivate the conductor layer, and the contact layer further constitutes an electric contacting-promoting layer and an adhesion-improving layer for enhancing the electric contact between the conductor layer and the thin film component and for stabilizing the adherence of the thin film component on the conductor layer, respectively.

2. The thin-film assembly according to claim 1, wherein via connections are provided in the printed circuit board for the electronic contacting of the electrodes through the base body of the printed circuit board.

3. The thin-film assembly according to claim 1, wherein a feed through to the base electrode is provided in the printed circuit board directly below the base electrode.

4. The thin-film assembly according to claim 1, wherein the smoothed conductor layer, over surface areas having the dimensions of 20×20 µm$^2$ (micro-roughness), exhibits a maximum mean surface roughness 3 nm.

5. The thin-film assembly according to claim 1, wherein a contact layer is also provided below the top electrode.

6. The thin-film assembly according to claim 1, wherein the contact layer also constitutes a passivation layer for the electrode.

7. The thin-film assembly according to claim 1, wherein the contact layer also constitutes a stabilization layer for the adherence between the electrode and the adjacent thin-film layer.

8. The thin-film assembly according to claim 1, wherein the contact layer is a metallic layer.

9. The thin-film assembly according to claim 1, wherein the contact layer is formed by a conductive suspension or solution.

10. The thin-film assembly according to claim 1, wherein a thin-film passivation layer is applied on exposed base body zones uncovered from the conductor layer, said passivation layer preventing the contamination of the respective thin-film component by substances emerging from the base body.

11. The thin-film assembly according to claim 10, wherein the passivation layer is made of silicon dioxide, a sol-gel system or an epoxy compound.

12. The thin-film assembly according to claim 1, wherein the top electrode and, optionally, also the contact layer provided therebelow are designed to be at least translucent.

13. The thin-film assembly according to claim 12, wherein an electroluminescent device is provided as said thin-film component.

14. The thin-film assembly according to claim 13, wherein local base electrodes having individual feed throughs are provided on the printed circuit board within an insulating grid structure, with a planar electroluminescent thin-film system as well as a planar, or strip-wisely or symbol-wisely patterned, top electrode being arranged thereabove.

15. The thin-film assembly according to claim 12, wherein a light-emitting diode is provided as said thin-film component.

16. The thin-film assembly according to claim 12, wherein a photovoltaic assembly is provided as said thin-film component.

17. The thin-film assembly according to claim 1, wherein a sensor, in particular an optical sensor or a temperature sensor, is provided as said thin-film component.

18. The thin-film assembly according to claim 1, wherein a diode is provided as said thin-film component.

19. The thin-film assembly according to claim 1, wherein a transistor, in particular a field-effect transistor, is provided as said thin-film component.

20. The thin-film assembly according to claim 1, wherein a snubber is provided as said thin-film component.

21. The thin-film assembly according to claim 1, wherein a resistor and/or a capacitor is provided as said thin-film component.

22. The thin-film assembly according to claim 1, wherein an encapsulation is associated with said thin-film component.

23. The thin-film assembly according to claim 22, wherein said encapsulation is designed to be translucent or transparent.

24. The thin-film assembly according to claim 22, wherein an enclosed gas volume is present within said encapsulation.

25. The thin-film assembly according to claim 23, wherein said encapsulation carries color converting and/or index matching layers in alignment with the local base electrodes.

26. The thin-film assembly according to claim 1, wherein the printed circuit board is a flexible printed circuit board.

27. The thin-film assembly according to claim 26, wherein the thin-film component has a flexible structure.

28. The thin-film assembly according to claim 26, wherein an encapsulation is associated with said thin-film component, wherein said encapsulation is flexible.

29. The thin-film assembly according to claim 28, wherein said encapsulation is attached to the thin-film component via an adhesion-promoting layer.

30. The thin-film assembly according to claim 28, wherein said encapsulation, via a passivation layer serving as a barrier layer against moisture and air, is provided above the thin-film component, optionally above the adhesion-promoting layer.

31. The thin-film assembly according to claim 28, wherein the thin-film component is provided in the neutral plane between the flexible printed circuit board and the flexible encapsulation.

32. The thin-film assembly according to claim 26, wherein the flexible printed circuit board is transparent or translucent.

33. The thin-film assembly according to claim 26, wherein characterized by a configuration as a roll-up or folding sheeting material.

34. The thin-film assembly according to claim 8 wherein the metallic layer is made of aluminum, gold, palladium platinum or a metal alloy, or carbon, or a semi-conductive compound.

35. The thin-film assembly according to claim 9 wherein the conductive suspension or solution is based on polyaniline, polyethylene dioxithiophene/polystyrenesulfonic acid.

36. The thin-film assembly according to claim 12 wherein the top electrode and, optionally, also the contact layer provided therebelow are designed to be transparent.

37. The thin-film assembly according to claim 28 wherein said encapsulation a thin glass laminate or a polymer-oxide composite layer system.

* * * * *